(12) United States Patent
Petrin et al.

(10) Patent No.: US 11,565,778 B2
(45) Date of Patent: Jan. 31, 2023

(54) FLOATING SOLAR COLLECTOR ELECTROMAGNETIC COUPLERS

(71) Applicant: SOLAR PODS, INC., Pleasant Hill, CA (US)

(72) Inventors: Michael Petrin, Walnut Creek, CA (US); Peter Tormey, Concord, CA (US); Jef Tormey, Quincy, MA (US)

(*) Notice: Subject to any disclaimer, the term of this patent is extended or adjusted under 35 U.S.C. 154(b) by 177 days.

(21) Appl. No.: 16/893,103

(22) Filed: Jun. 4, 2020

(65) Prior Publication Data
US 2021/0171163 A1   Jun. 10, 2021

Related U.S. Application Data

(63) Continuation of application No. 15/273,457, filed on Sep. 22, 2016, now Pat. No. 10,807,685.

(51) Int. Cl.
| | |
|---|---|
| B63B 35/44 | (2006.01) |
| H02S 40/36 | (2014.01) |
| H01L 31/02 | (2006.01) |
| H01L 31/054 | (2014.01) |
| H02S 40/38 | (2014.01) |
| B63B 35/38 | (2006.01) |

(52) U.S. Cl.
CPC .............. *B63B 35/44* (2013.01); *B63B 35/38* (2013.01); *H01L 31/02021* (2013.01); *H01L 31/0543* (2014.12); *H02S 40/36* (2014.12); *H02S 40/38* (2014.12); *B63B 2035/4453* (2013.01); *Y02E 10/52* (2013.01)

(58) Field of Classification Search
None
See application file for complete search history.

(56) References Cited

FOREIGN PATENT DOCUMENTS

| CN | 104506131 A | * | 4/2015 | ............ H02S 40/00 |
| WO | WO-2008036142 A1 | * | 3/2008 | ............ H01F 3/06 |

OTHER PUBLICATIONS

Machine Translation CN 104506131 (Year: 2015).*

* cited by examiner

*Primary Examiner* — Shannon M Gardner
(74) *Attorney, Agent, or Firm* — Antero Tormey & Petrin; Peter Tormey; Michael Petrin

(57) ABSTRACT

The present disclosure relates generally to electromagnetic coupling modules employed along the outer periphery of floating solar collector pods that can be introduced onto the surface of a body of water that operate to automatically connect to one another so that proximate pods form a reversible self-assembled physically and electrically coupled array that operate to harvest incident solar radiation and also operate to reduce the degree of evaporative water loss from that body of water. Electromagnetic coupling modules are disclosed featuring normally open electrical connection elements that permit electronic coupling under magnetic attraction for improved electrical safety. Electromagnetic coupling modules are disclosed that are gimbaled to provide for increase flexibility and interconnectivity under angular displacement, such as when a floating solar pod array is subject to strong current, wind and wave forces.

9 Claims, 17 Drawing Sheets

CUTAWAY SIDE VIEW

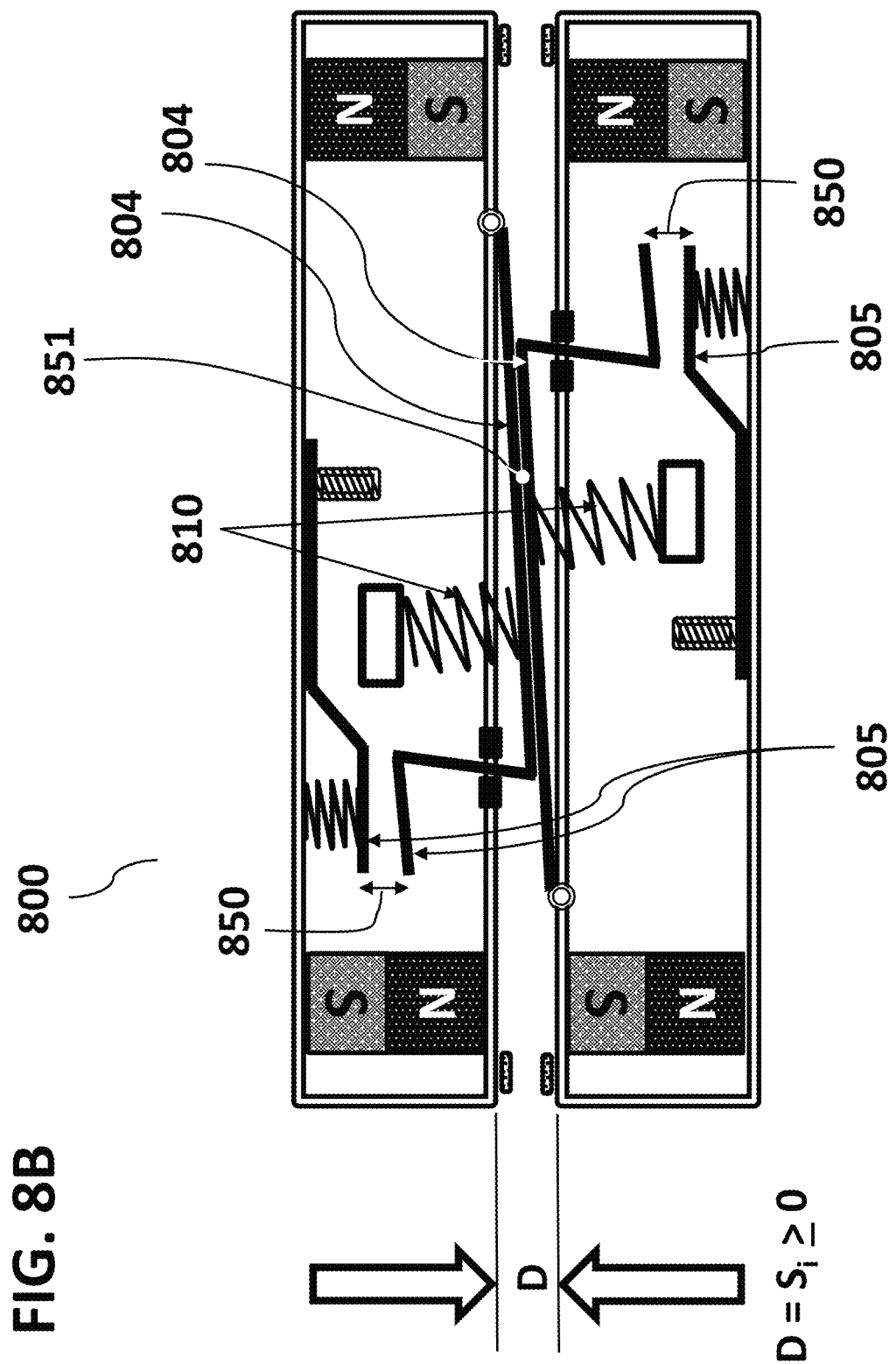

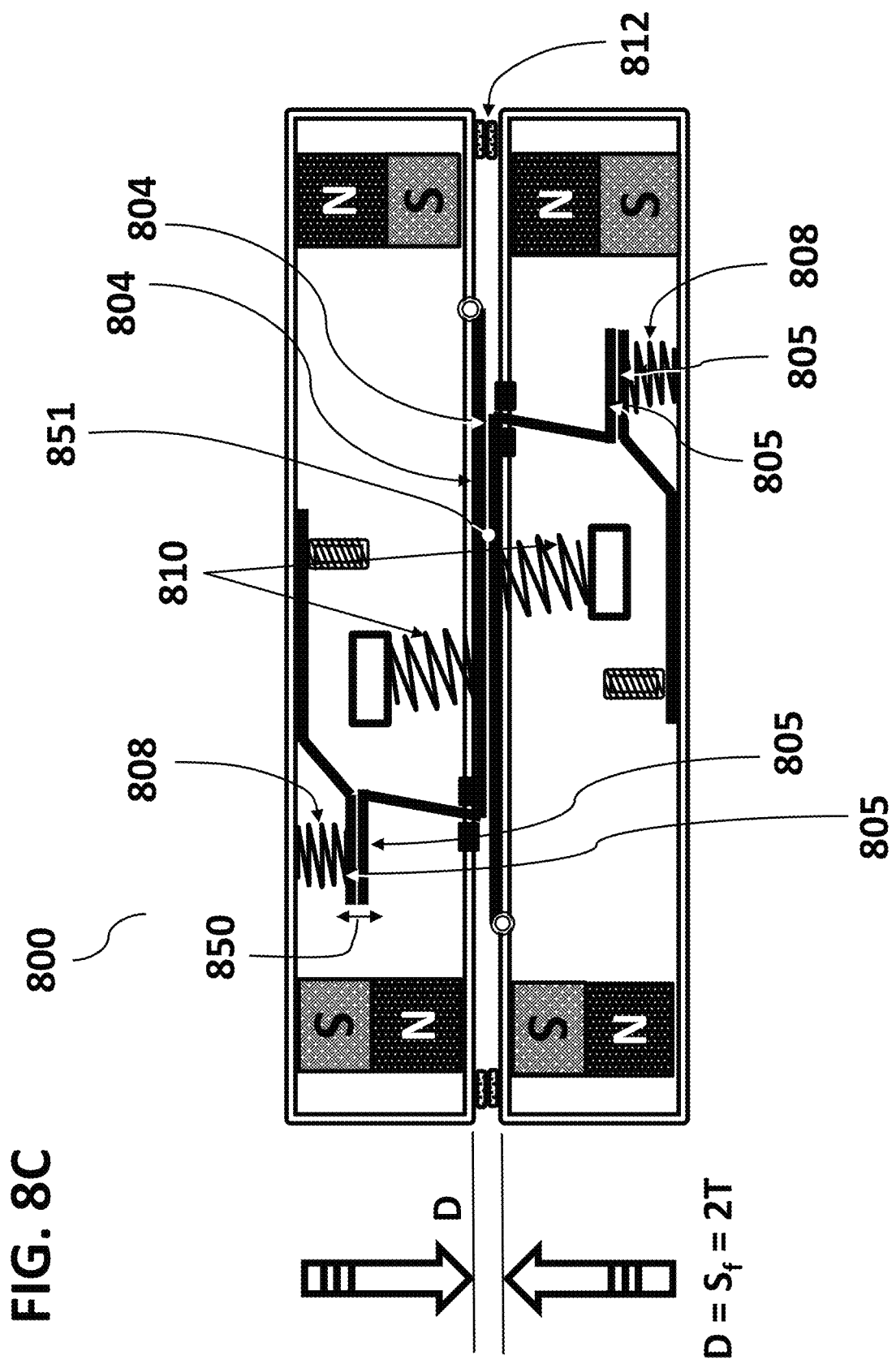

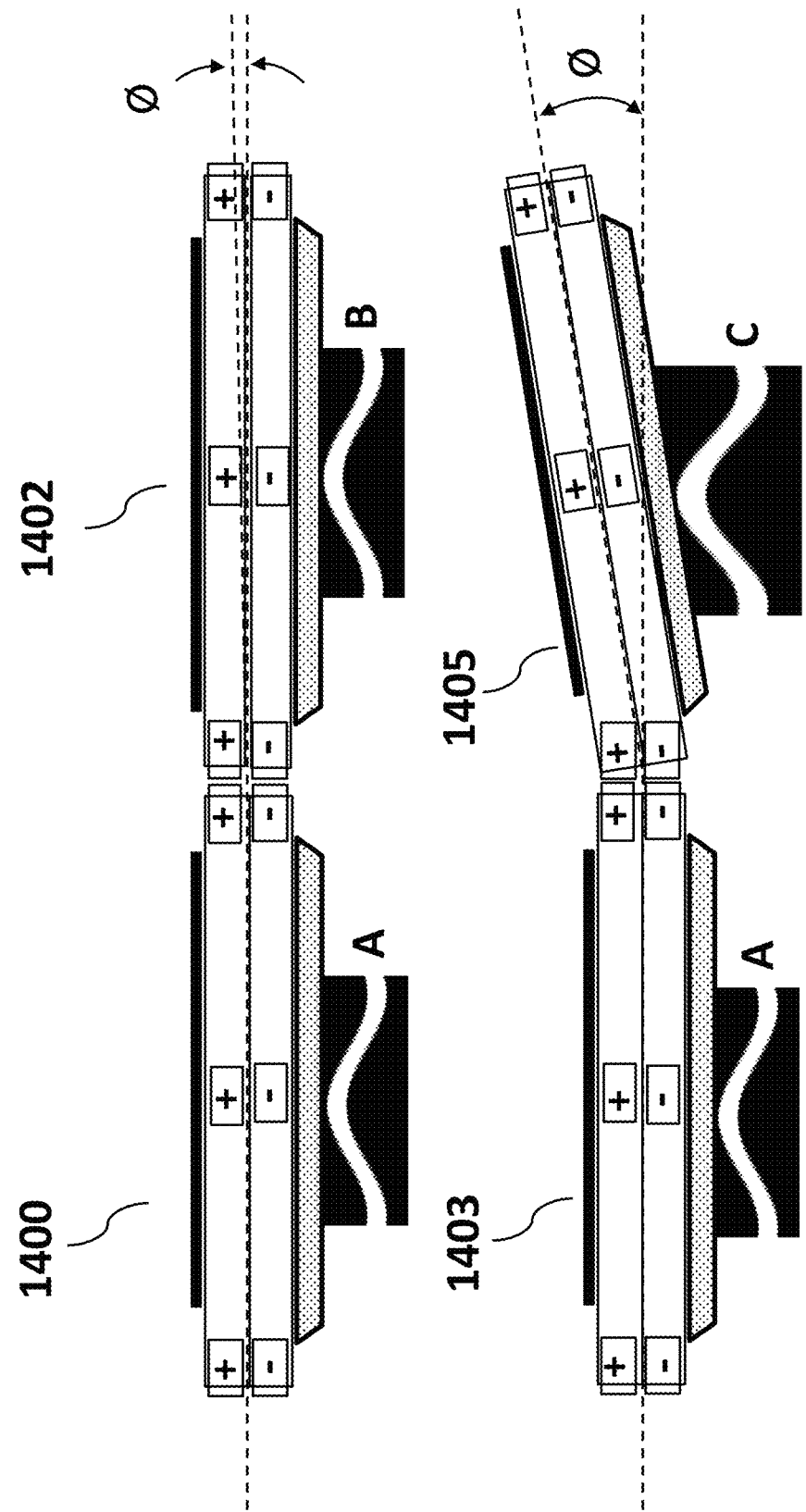

FLOATING SOLAR COLLECTOR ELECTROMAGNETIC COUPLERS

PRIORITY

This application claims the benefit of the priority of the following United States patent applications: U.S. Provisional application No. 62/222,735, filed on Sep. 23, 2015; U.S. Provisional application No. 62/264,300, filed on Dec. 7, 2015; and U.S. Utility application Ser. No. 15/273,457 (also published as Pub. No. US2017/0085213A1), filed on Sep. 22, 2016, all of which are incorporated in their entirety by reference herein.

BACKGROUND

The present invention relates generally to means to physically couple and electronically connect a plurality of floating solar collector devices such as floating solar pods. It would be desirable that while in operation generating electricity, that solar pods are equipped with electromagnetic coupling modules on their peripheries that enable them to electronically couple with adjacent solar pods, yet have some means to prevent loss of electrical current, charge dissipation, voltage drop and the potential of producing an electrical shock should an uncoupled (free and unpaired) electromagnetic coupling module come into contact with a grounding source or electrically conductive object that is not part of the solar pod array, for example a buoy, person, boat, metal dock or conductive floating object on the surface of the water on which the solar pod array is present. The present disclosure more specifically relates to electromagnetic coupling modules that are in a "normally open" or electrically non-conductive state such that even if electrical charge or current is present on one active electrode of the electromagnetic coupling module, a second electrode required for current transmission between adjacent solar pods remains "de-energized" or without electrical potential until the electromagnetic coupling module actually comes into physical contact with and engages a second electromagnetic coupling module. Accordingly, when two such pairs of the electromagnetic coupling modules located on adjacent solar pods come into contact with one another (for example, when driven my magnetic attraction), the physical contact produces a relative displacement in position between the first and second electrodes within both the first and second electromagnetic coupling modules sufficient to bring the electrodes into electrically conductive contact with each other which then brings the two adjacent electromagnetic coupling modules into electrical contact with one another.

Unlike fixed-in-place or mounted solar voltaic systems, any solution must also provide for the relative motion and displacement of floating solar pods deployed on a surface of an open body of water where wave, wind and currents act on the individual solar pods as well as an interconnected array that would otherwise result in separation and decoupling of one or more of the solar pods, reducing solar efficiency.

Embodiments of the present disclosure address the above issues and offer several alternative electromagnetic coupling modules that are ideally suited for use with floating solar collector devices and more particularly with polygonal shaped floating solar pods.

SUMMARY

Disclosed herein are electromagnetic coupling modules that are configured in a "normally open" (hereinafter "NO") or electrically non-conductive state such that even if electrical charge or current is present on one active electrode of the electromagnetic coupling module, a second electrode required for current transmission between adjacent solar pods remains "de-energized" or without electrical potential until the electromagnetic coupling module actually comes into physical contact with and engages a second electromagnetic coupling module. When two such pairs of the electromagnetic coupling modules located on adjacent solar pods come into contact with one another (driven my magnetic attraction), the physical contact produces a relative displacement in position between the first and second electrodes within both the first and second electromagnetic coupling modules sufficient to bring the electrodes into electrically conductive contact with each other which then brings the two adjacent electromagnetic coupling modules into electrical contact with one another.

Disclosed herein is an inventive embodiment of an electromagnetic coupling system comprising (a) at least two electronic coupling modules; wherein the electronic coupling modules each have (1) a first electrode assembly; (2) a second electrode assembly; wherein the first and second electrode assemblies each have a primary male electrode element, a secondary female electrode element and at least one spring tensioning element; wherein the primary and secondary electrode elements are normally biased in an electronically open circuit configuration by means of the spring tensioning element; (b) at least one permanent magnetic coupling element; (c) a gimbal mounting system; and (d) a housing module; wherein the permanent magnetic coupling element has a north pole and a south pole; and wherein the permanent magnetic coupling element is located within the housing module.

Also disclosed herein are further inventive embodiments of an electromagnetic coupling system wherein the permanent magnetic coupling element is located on the gimbal mounting system; and wherein the gimbal mounting system is located within the housing module enabling the permanent magnetic coupling element to freely rotate into alignment position with a second permanent magnetic coupling element presenting either a north or south pole with respect to the first permanent magnetic coupling element.

Another inventive embodiment disclosed is an electromagnetic coupling system wherein the first and second electrode assembly are positioned adjacent to the gimbal mounting system; wherein the permanent magnetic coupling element is located within the gimbal mounting system and oriented perpendicularly to an axis of rotation passing through the gimbal mounting system; and wherein the first and second electrode assembly are positioned above and below the gimbal mounting system and located on a plane coincident to the axis of rotation of the permanent magnetic coupling element.

In yet another inventive embodiment, is an electromagnetic coupling system wherein the spring tensioning element is attached to the secondary female electrode element and a second spring tensioning element is attached to the primary male electrode; and wherein the secondary female electrode element includes an electrical contact brush located on a distal end facing the exterior of the housing module, and wherein the housing module further includes one or a plurality of spring tensioning element retainers; at least one male electrode spring retainers; at least one female electrode spring retainers; and wherein the housing module further includes a air gap drainage channel located on a lower, bottom facing side of the housing module in communication with a bore through the housing module accommodating at least one of the first and second electrode assemblies.

In a related inventive embodiment, the electromagnetic coupling system has an electrical contact brush that features a curved front contact surface and a flat rear surface; wherein the front contact surface is optionally configured with a textured surface.

In yet another inventive embodiment, an electromagnetic coupling system is disclosed having (a) at least two electronic bar coupling modules; wherein the electronic bar coupling modules each have (1) a first external contact element; (2) a second internal contact element; and (3) an external contact spring tensioning element; wherein the first external contact and the second internal contact elements are normally biased in an electronically open circuit configuration by means of the external contact spring tensioning element; (b) a first and second permanent magnet coupling element; wherein the permanent magnetic coupling elements each have a north pole and a south pole; (c) a gimbal mounting system; wherein the gimbal mounting system has a first left cylinder mount and a second right cylinder mount; and (d) a housing module; wherein the permanent magnetic coupling elements are located within the housing module; wherein a first south pole of the first magnetic coupling element faces outward toward a contact face of the electromagnetic coupling system; wherein an opposed first north pole of the first magnetic coupling element faces inwards; wherein a second south pole of a second magnetic coupling element and its north pole are situated adjacently on the contact face so that only one of the south poles and one of the north poles of the first and second permanent magnet coupling elements faces outward toward the contact face; wherein the housing module is located between the first left and second right cylinder mounts of the gimbal mounting system; and wherein the first left and second right cylinder mounts are opposed to one another and located on a first left side and second right side of the housing module.

In another inventive embodiment, an electromagnetic coupling system is disclosed featuring a first external contact element that is anodic and a second external contact element that is cathodic; wherein the first and second external contact elements are located adjacent one another in a parallel configuration in a first top position and a second bottom position, respectively; wherein the first and second external contact elements are situated on the contact face of the electromagnetic coupling system; wherein the first external contact element is located above a gimbal axis of rotation passing through the gimbal mounting system from the first left cylinder mount to the second right cylinder mount; and wherein the first top position and the second bottom position are opposed about a plane coincident with the gimbal axis and perpendicular to the contact face.

In a further inventive embodiment, an electromagnetic coupling system is disclosed wherein at least one of the first left and second right cylinder mounts are electrically in contact with a contact element selected from an internal contact element, external contact element, contact element swivel joint and external contact terminal lead, and combinations thereof, and optionally wherein the housing module bears one or a plurality of bumper elements on a front contact surface of the housing module; and optionally wherein the housing module bears one or a plurality of contact element grommets through which slidingly engage each of the external contact elements.

In another inventive embodiment, an electromagnetic coupling system is disclosed wherein the housing module features at least one external contact spring retainer that tensions the external contact spring in and biases it in a normally open position; wherein the external contact spring compresses sufficiently during a coupling event between the at least two electronic bar coupling modules to enable contact with the internal contact element; and optionally wherein the external contact element includes a contact element swivel joint on a distal end opposed to a proximate end bearing an internal electrical contact surface.

Also disclosed herein are inventive embodiments of an electromagnetic coupling system wherein the external contact element features an external contact portion bearing an external electrical contact surface adjacent to a first inflection elbow transitioning to a sweep portion adjacent to a second inflection elbow transitioning to an internal contact portion bearing an internal electrical contact surface; wherein the sweep portion is in the shape of a partial arcuate curve with radius equal to RC; and optionally wherein the housing bears an internal contact spring that engages with the internal contact element.

In a further inventive embodiment, an electromagnetic coupling system is disclosed as a means for intercoupling a self-assembling solar pod array featuring (a) a plurality of polygonal shaped solar pods of side n, wherein n is selected from 4, 5, 6, and 8, and combinations thereof that enable gapless tiling of a selected horizontal surface area by the plurality of the solar pods when intercoupled; (b) a plurality, n, of electromagnetic coupling systems located on an exterior face of each side n of the solar pods; each of the solar pods having (c) at least two electronic bar coupling modules on each of the exterior faces of the solar pods; wherein the electronic bar coupling modules each have (1) a first external contact element; (2) a second internal contact element; (3) an external contact spring tensioning element; wherein the first external contact and the second internal contact elements are normally biased in an electronically open circuit configuration by means of the external contact spring tensioning element; (4) a first and second permanent magnet coupling element; wherein said permanent magnetic coupling elements each have a north pole and a south pole; (5) a gimbal mounting system; wherein the gimbal mounting system has a first left cylinder mount and a second right cylinder mount; and (6) a housing module; wherein the permanent magnetic coupling elements are located within the housing module; wherein a first south pole of the first magnetic coupling element faces outward toward a contact face of the electromagnetic coupling system; wherein an opposed first north pole of the first magnetic coupling element faces inwards; wherein a second south pole of a second magnetic coupling element and its north pole are situated adjacently on the contact face so that only one of the south poles and one of the north poles of the first and second permanent magnet coupling elements faces outward toward the contact face; wherein the housing module is located between the first left and second right cylinder mounts of the gimbal mounting system; and wherein the first left and second right cylinder mounts are opposed to one another and located on a first left side and second right side of the housing module.

These and other inventive embodiments of the present disclosure are described in greater detail hereinbelow.

BRIEF DESCRIPTION OF THE DRAWINGS

FIG. 14 shows an illustration of two coupled solar pods floating on the surface of a water body subject to wave action.

Figure 1:
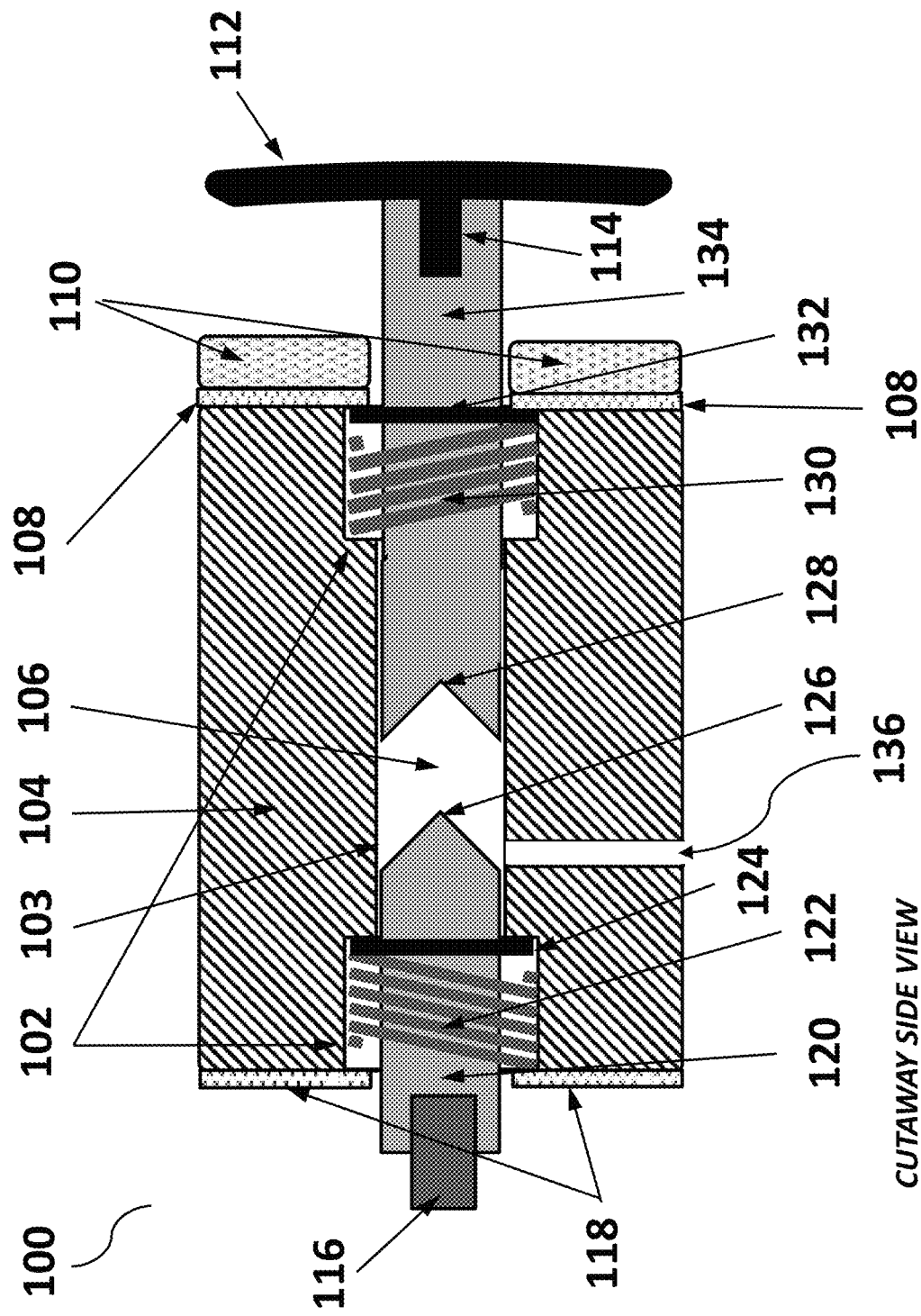
FIG. 1 shows an electromagnetic coupling module in a NO configuration being in a nonactivated and non-conductive state.

A corresponding Figure Key detailing the specific component parts, regions and means of the present disclosure is attached hereinbelow in an Appendix.

DESCRIPTION

Generality of Invention

This application should be read in the most general possible form. This includes, without limitation, the following:

References to specific techniques include alternative and more general techniques, especially when discussing aspects of the invention, or how the invention might be made or used.

References to "preferred" techniques generally mean that the inventor contemplates using those techniques, and thinks they are best for the intended application. This does not exclude other techniques for the invention, and does not mean that those techniques are necessarily essential or would be preferred in all circumstances.

References to contemplated causes and effects for some implementations do not preclude other causes or effects that might occur in other implementations.

References to reasons for using particular techniques do not preclude other reasons or techniques, even if completely contrary, where circumstances would indicate that the stated reasons or techniques are not as applicable.

Furthermore, the invention is in no way limited to the specifics of any particular embodiments and examples disclosed herein. Many other variations are possible which remain within the content, scope and spirit of the invention, and these variations would become clear to those skilled in the art after perusal of this application.

Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Detailed Description

FIG. 1 shows one embodiment of the present disclosure featuring a "normally open" (or NO) electromagnetic coupling module 100 featuring an insulating electrode block 104 made of a non-conductive material and suitable for the construction of the coupling module and hosting the various components illustrated in the figure. The insulating electrode block 104 features one or plurality of a spring bore cutouts 102 on opposed sides of block 104 of a depth sufficient to accommodate a plurality of tensioning springs (122 and 130) that operate in conjunction with retaining washers (108 and 118) to maintain a spring tension force between the insulating electrode block 104 and each of a male electrode element 120 and a female electrode element 134. In one embodiment, the bore cutouts 102 are cylindrically shaped holes corresponding to the outer dimensions and shape of either the male or female electrode element that are positioned within, with some suitable clearance spacing to enable the electrodes to freely move within and along the length of the bore as required to make and break electrical contact. In other embodiments, the electrode elements and bore can be of other shapes including rods and bores having round, triangular, square, hexagonal, polygonal, star or other complementary shapes.

The male electrode element 120 and a female electrode element 134 may in one embodiment be round (circular) shaped pins in cylindrical form constructed of a suitable conductive material (e.g. a metal) that each further feature one or a plurality of seating grooves (not shown, but positioned where the spring retainer washer 124 and 132 are shown) that act to retain either spring retainer washer 124 or 132 and which functions to maintain a spring tension force, compression force or pressure bias against the electrodes and the insulating electrode block 104, so that the two electrodes 120 and 134 are normally spaced apart with an intervening air gap 106 between them that is sufficiently large so as to prevent the transmission of an electrical current or electric field between the said electrodes when in a normally open or tensioned configuration as shown in FIG. 1.

In one embodiment, the normally energized male electrode 120 is energized by an electrical charge being present at male electrode coupling terminal 116 and is held in position and centered within the electrode bore cutout 103 by means of the spring force produced by the male electrode rebound spring 122 pressing against the male rebound spring washer 124 and the male electrode spring retainer washer 118. This arrangement in this particular embodiment enables a slight displacement of the male electrode element 120 within the electrode bore cutout 103, which serves to release tension and prevent deformation of the male electrode 120, and in particular, helps to protect the tapered end of the electrode or male electrode centering point 126 when it is engaged by the female electrode element 134. In a similarly corresponding manner, the female electrode element 134 is held in position and centered within the electrode bore cutout 103 by means of the spring force produced by the female spring unit 130 pressing against the female spring washer 132 and the female electrode spring retainer washer 108 and the inner planar face (lip of the bore) located at the inner bore transition between the spring bore cutout 102 and the insulating electrode block 104 against which the inner side of the female spring unit 130 presses.

FIG. 1 also shows an embodiment of the present disclosure featuring an optional air gap drainage channel 136 that functions to prevent over or under pressurization within the electrode bore cutout 103 region defining the air gap 106, and further functions to enable any trapped materials, such as for example, water, oil, dust, residue and other foreign materials to be displaced from the air gap 106 as either of the two electrode elements 120 and 134 move or are repositioned during operation.

FIG. 1 also shows an embodiment of the present disclosure featuring an optional electrical coupling bumper guard 110 located on the outward facing side (right) of the electromagnetic coupling module 100 positioned in contact with either the face of the insulating electrode block 104 or the female electrode spring retainer washer 108 (depending on the size of the washer 108) or combination of the two, so as to provide a resilient compressible means to retard or prevent excessive inward motion of the female electrode element 134 and the transmission of force by the female electrode element 134 to the male electrode element 120 when the former is brought into engagement when the electrical contact brush 112 is pushed and repositioned in an inward direction toward the electromagnetic coupling module 100 as the female electrode element 134 moves inwardly along the confines of the electrode bore cutout 103. The optional electrical coupling bumper guard 110 is selected from a suitable resilient and compressible material that can be compressed and regain its original shape over many cycle times and maintain its performance characteristics when wet and over a range of temperatures, and may be selected from, but not limited to, materials including rubber, elastomer, leather, silicone, polymers, springy materials, foamy materials, foams, springs, composites, and the like. Optionally, the electrical coupling bumper guard 110 is preferably constructed from an electrically non-conductive material. In operation, the electrical coupling bumper guard 110 operates to prevent the excessive displacement of the female electrode element 134 as the female electrode receiving anvil 128 portion of the electrode is brought into contact with the correspondingly complementary shaped male electrode centering point 126, the latter two functioning to help keep the respective male and female electrode elements 120 and 134 in a mutually co-aligned and co-linear orientation and position within the electrode bore cutout 103 as they move, and further to increase the effective cross-sectional surface area present on the two faces of the respective electrical coupling region defined by the male electrode centering point 126 and the female electrode receiving anvil 128 present on the mating surfaces of the respective male and female electrode elements 120 and 134.

FIG. 1 also shows an embodiment of the present disclosure having an optional electrical coupling pin 114 that functions as both a physical and electrical connection point between the electrical contract brush 112 and the female electrode element 134, enabling the electrical contract brush 112 to be more easily removed and replaced as necessary owing to wear and tear during operation. In addition, FIG. 1 also shows an embodiment of the present disclosure having an optional male electrode coupling terminal 116 located on the outside end of the male electrode element 120 that functions as both a physical and an electrical connection point between an external electrical circuit and the male electrode element 120. In these and related embodiments, the coupling pin 114 and the coupling terminal 116 are composed of electrically conductive materials, such as metals, metalloids, metal alloys, conductive polymers and compositions, and the like, and are configured to function as fasteners between the respective elements that they are connecting, using known fastening means in the art, including for example, but not limited to cotter pins, crimps, screws, threads, rivets, friction fit spline and sleeve, pins, and the like.

Figure 2:
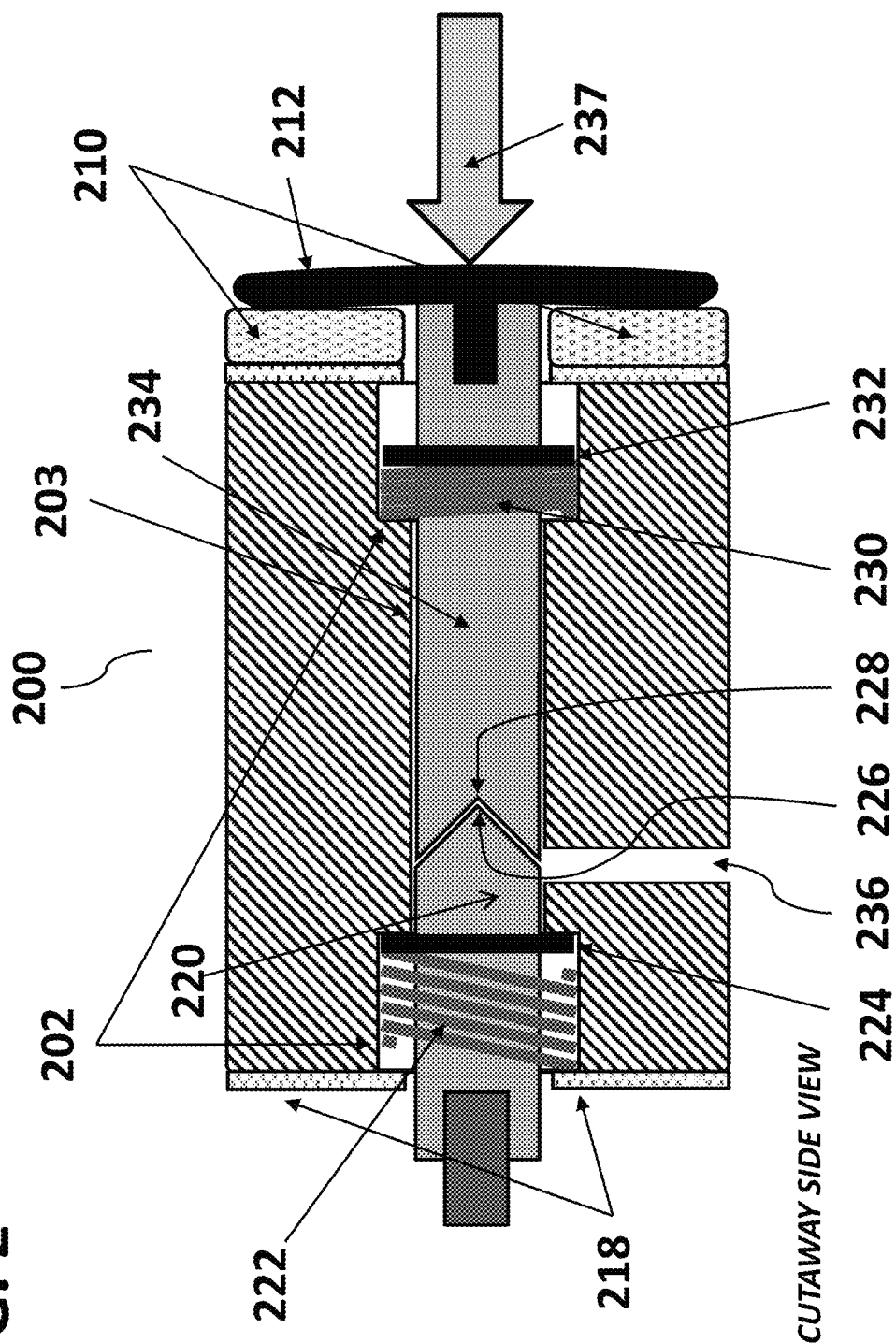
FIG. 2 shows an electromagnetic coupling module compressed by external force in an activated and conductive state.

FIG. 2 shows one embodiment of the present disclosure featuring a normally open electromagnetic coupling module 200 in a closed or electrically coupled configuration corresponding to that shown in FIG. 1 after a compression force 237 in the direction indicated in FIG. 2 has been applied to the electrical contract brush 212 causing the female electrode element 234 to move inwardly and thus compressing the female spring unit 230 owing to the force of compression of force 237 and thus further acting to bring the contact points 226 and 228 of ends of the two corresponding male electrode element and the female electrode element 234 into intimate physical and electrical contact to establish an electrical connection. In the embodiment of the present disclosure shown in FIG. 2, it is seen that that the compression force 237 causes the electrical contact brush 212 to move to the left (inward) pushing the female electrode element 234 inward, resulting in the female stop springer washer 232 located on the female electrode element 234 shaft to apply pressure to the female spring unit 230 which becomes compressed between the end of the electrode bore cutout 203 near the end (most internal point) of the corresponding spring bore cutout 202 face against which the inner most side of the female spring unit 230 is in tensioned contact.

FIG. 2 shows one embodiment of the present disclosure wherein the compressed configuration of the electromagnetic coupling module 200 features an electrical contact between the male electrode element 220 and the female electrode element 234 owing to the compression force applied in the direction 237 against the electrical contract brush 212 and causing the brush assembly 212 and associated female electrode element 234 to be displaced inwardly (to the left in FIG. 2) resulting in the leading surface or female electrode receiving anvil 228 being driven into intimate contact with the trailing surface or male electrode centering point 226 and thus establishing an electrical connection passing through the electrical contact brush 212 to the distal end of the male electrode element 220. Any excess of force 237 resulting in the excessive displacement of the female electrode element 234 is countered in part by the spring force of the female spring unit 230 acting in concert against the spring bore cutout 202 face and the female stop spring washer 232 that is positioned at a point along the male electrode element 220 as described herein. In addition, any excess travel of the female electrode element 234 beyond the normal compressed engagement point as illustrated in FIG. 2, results in the slight initial displacement (leftward as shown) and recovery of the male electrode element 220 owing to compression of the associated spring tensioning elements associated with the male electrode element, namely any over compressive force acts to compress the male rebound spring 222 against the face of the spring bore cutout 202 and male electrode spring retainer washer 218, which then repositions the male electrode element 220 to the neutral contact point meeting the compressed female electrode assembly. This serves to protect the male and female electrode elements from over compression and possible deformation that would otherwise hinder the smooth translational movement of the respective electrodes within the bore cutout 202.

Figure 3:
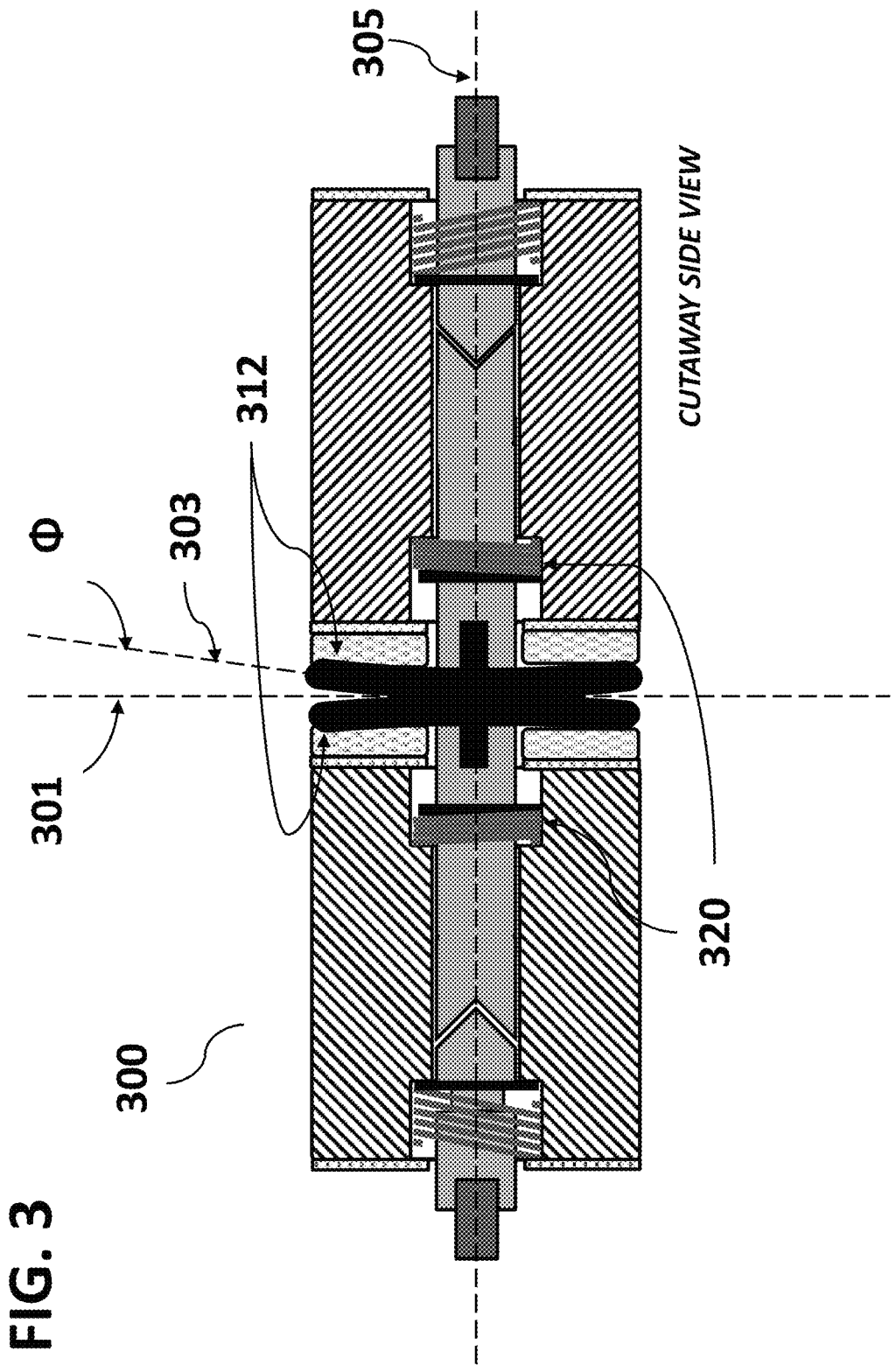
FIG. 3 shows two adjacent electromagnetic coupling modules engaged and in a dual activated and thru-conductive state.

FIG. 3 shows one embodiment of the present disclosure in which two normally open "NO" electromagnetic coupling modules 300 are positioned around a center point of contact under tension sufficient to compress both respective electrode element assemblies (denoted by both female spring assemblies being in a compressed state 320) and establish a continuous electrical conductive pathway from one end of a first coupling module to the distal end of a second coupling module. Here, a line denoting the horizontal coupling axis 305 shows a nominal, neutral coplanar or collinear arrangement between the respective coupling modules 300, corresponding to an angular slope 303 of 0° (zero degrees). However, owing to the angular or curved and slightly offset surfaces of the electrical contact brushes 312 on the respective coupling modules 300, good electrical contact is made even at an angular slope 303 that is slightly offset from the straight line axis 305. In addition, compression forces are transmitted from the contacting electrical contract brushes 312 sufficient to compress the electrode element assemblies to establish internal electrical connectivity to each of the otherwise normally open or non-conductive electromagnetic coupling module 300. The strength of the magnets are selected so that intercoupling modules can overcome compression spring forces to first activate the electrodes by closing of the circuit and establish electrical connectivity, and hold the modules tightly enough by magnetic force to keep them coupled even when the coupling modules are subject to some displacement forces or subject by motion such as wave action and one or more modules are displaced at a relative angle, theta ($\Phi$) with respect to one other. Theta may be between −45° and 45°, or alternatively between −30° and 30°, or alternatively between −20° and 20°, or alternatively between −10° and 10°, or alternatively between −5° and 5°, the angle being defined with respect to the plane 301 defining the contact plane between the respective electrical contact brushes 312 and the tilt angle, theta ($\Phi$).

Figure 4:
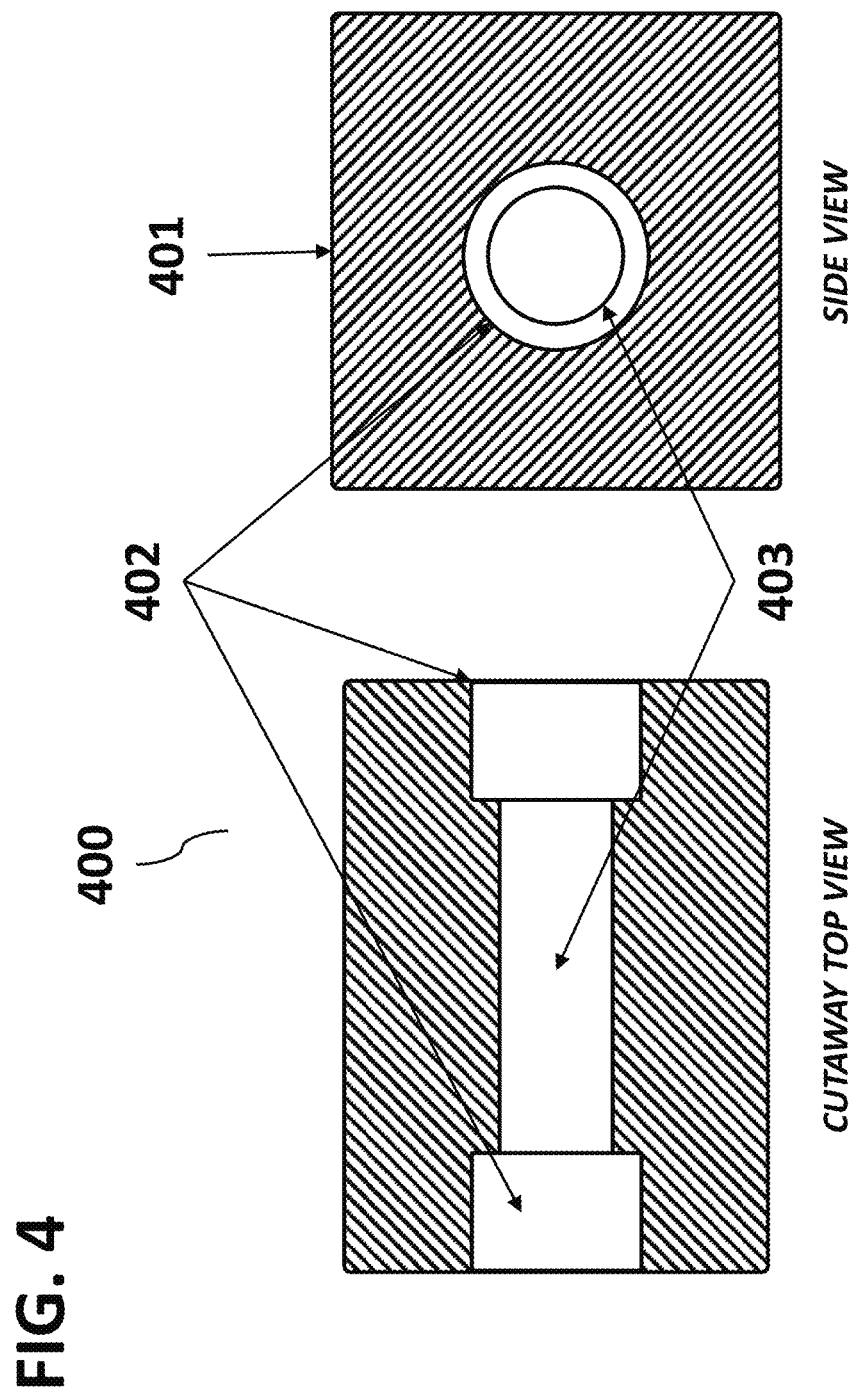
FIG. 4 shows a block housing for a single electromagnetic coupling module.

FIG. 4 shows one embodiment of the present disclosure featuring a single electromagnetic coupling module block 401 having a single electrode bore cutout 403 that passes through the length of the block 401, with both outwardly facing or distal ends of the bore cutout 403 featuring a larger diameter spring bore cutout 402 that can accommodate the male and female electrode springs. The side view (right hand illustration) of the single electromagnetic coupling module block 401 shows one face of the bore cutout 403 at the transition of the spring bore cutout 402, that face being the surface against which the electrode springs are normally tensioned.

Figure 5:
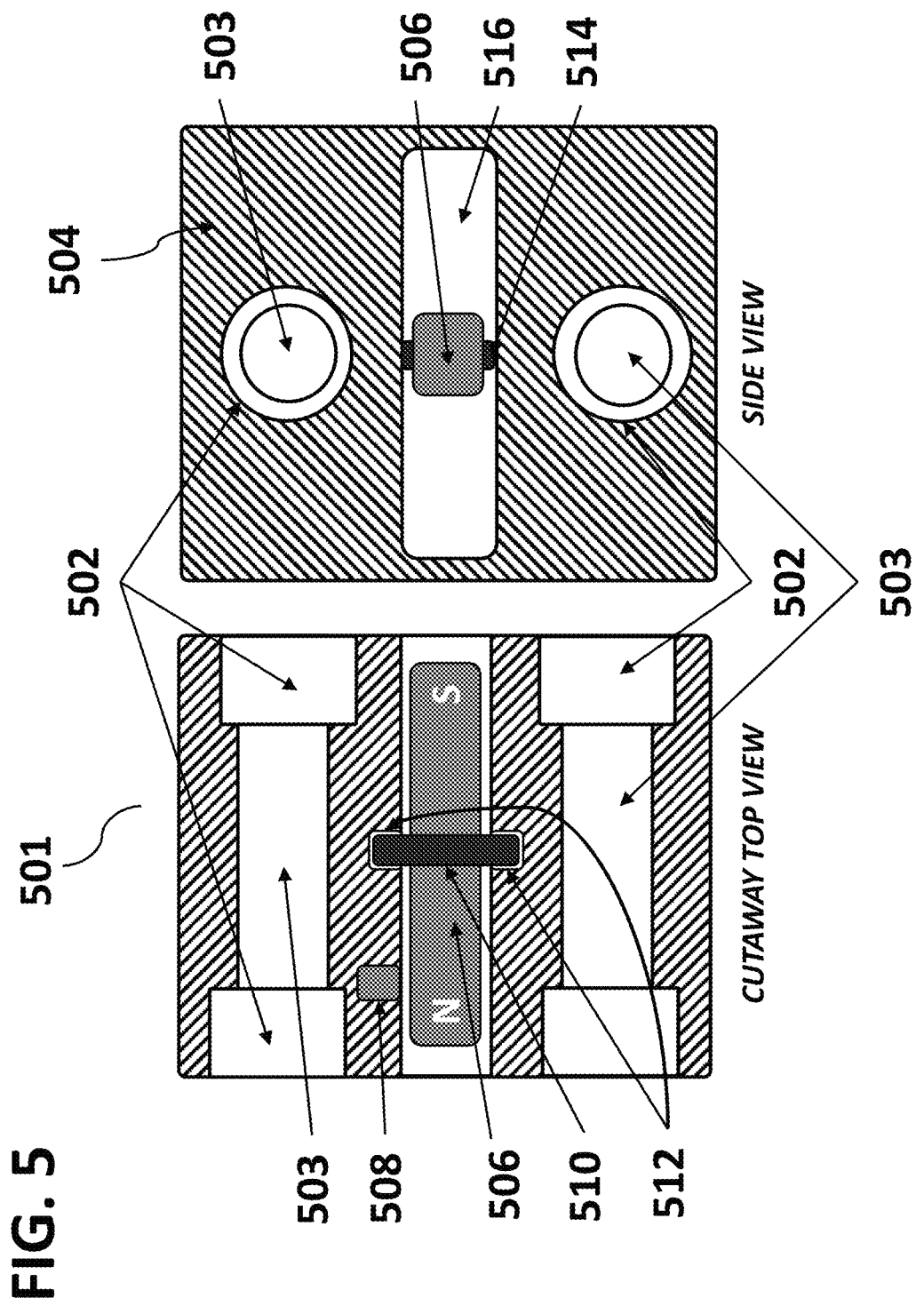
FIG. 5 shows a dual electromagnetic coupling module from a front and side cutaway perspective illustrating a gimballed magnetic coupler.

FIG. 5 shows one embodiment of the present disclosure featuring a dual electromagnetic coupling module 501 having two spring bore cutouts 502 and two electrode bore cutouts 503 within a single (monolithic) insulating electrode block 504 which also features a magnetic coupling module comprising a magnet 506, an optional dampening element 508 and a pivot rod 510 that rotationally supports and suspends the magnet 506 centered within the magnet bore cutout 516, by means of the pivot rod 510 suspending the magnet using two opposed pivot bearing elements 512 fitted into two opposed pivoting magnet bore outs 514 that enable the free rotation of the pivot rod 510 and the magnet 506 about the pivot rod axis. In operation, the magnet 506 having a south and north pole, rotates freely about the pivot rod axis, dampened only by the attraction to or between the magnet 506 and the optional dampening element 508, if present. However, when a second dual electromagnetic coupling module 501 is brought into close proximity to each other, the corresponding pairs of magnets 506 re-orientate themselves into a mutually attractive N-S or S-N relative magnetic orientation that acts as an attractive force to bring the two dual electromagnetic coupling modules 501 into contact, resulting in the electromagnetic coupling modules (detail not shown in FIG. 5) to align and form an electrical connection as shown in FIG. 3.

In these inventive embodiments presented here, the coupling modules may be further mounted on a gimbal frame enabling some degree of swiveling motion to the coupling modules so that adjacent modules on two or more solar pods bearing the modules along their edges, can intercouple and remain magnetically and electrically attached and in electronic communication with each other even when one or more solar pods are moving with respect to one another, such as for example, when a plurality of solar pods are interconnected via coupled modules and are floating on a surface of water subject to some degree of wave action that can move the orientation of the floating solar pods and hence change the coupling angle between them, as further described in FIG. 5.

Figure 6:
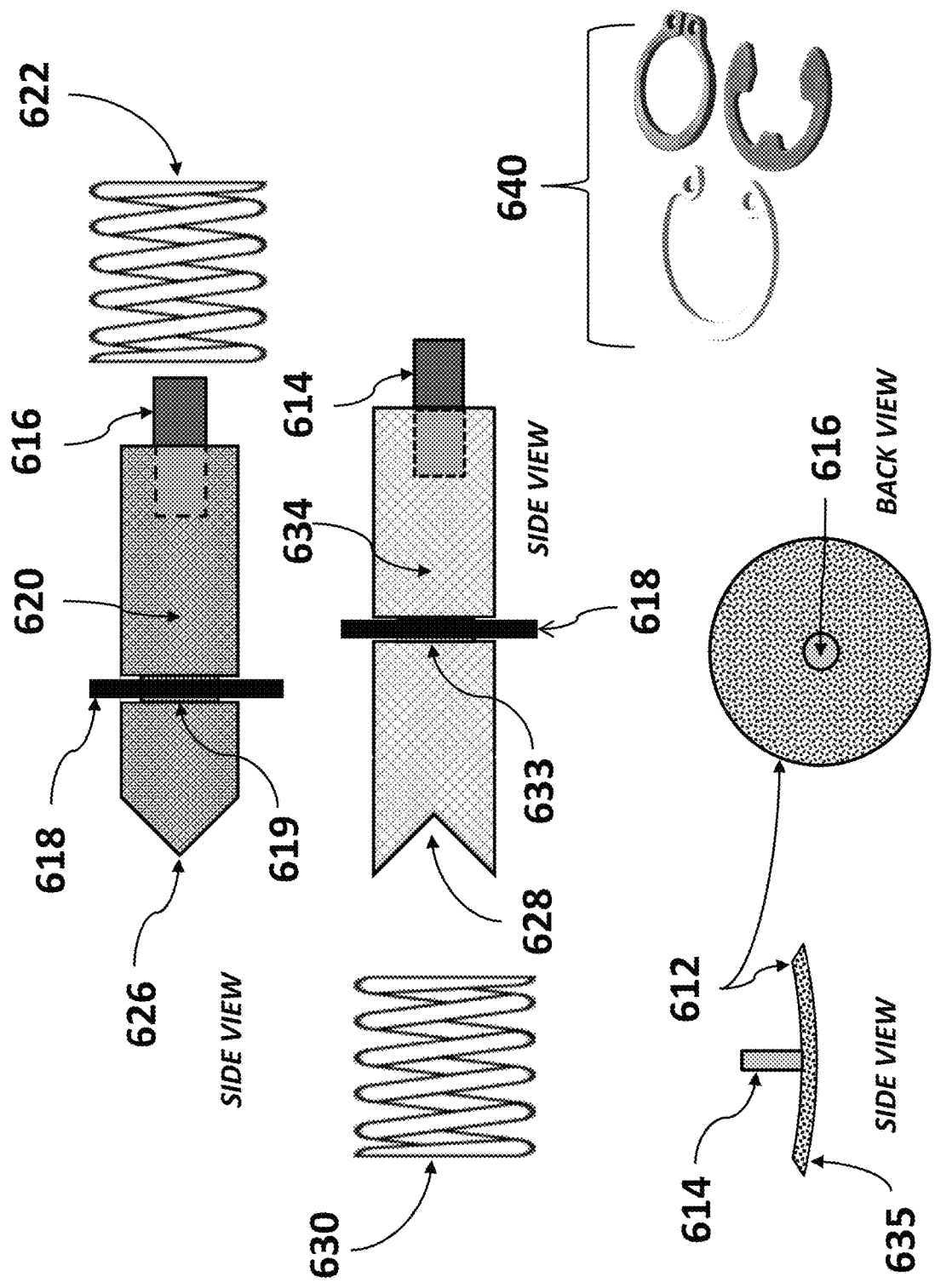
FIG. 6 shows various components used in assembling an embodiment of an electromagnetic coupling module.

FIG. 6 illustrates details of the male and female electrodes and spring tension elements in one embodiment of the present disclosure by way of some examples of common springs, clips and other elements capable of being used to construct the coupling modules of the disclosure. In FIG. 6, the electrical contact brush 612 is shown with an electrical coupling pin 614 that enables a wire or electrical lead to be attached to this assembly in a side view and also a top view showing the approximately centered position of the male electrode coupling terminal 616. In other embodiments, the shape, size and curvature of the electrical contact brush contact surface 635 can be varied and adjusted as needed to accommodate the desired degree of freedom with respect to the coupling angle, $\Phi$, between the surfaces of the respective contact brushes 635.

FIG. 6 also illustrates details of one embodiment of the present disclosure featuring a male electrode assembly (top) having a male electrode spring retainer washer 618 that is fitted to a male electrode spring washer seating groove 619 positioned along the shaft of the male electrode element 620 and a male rebound spring 622 that is normally compressed against the right side face of the male electrode spring retainer washer 618. Here, additional optional features including a male electrode centering point 626 and a male electrode coupling terminal 616.

FIG. 6 further illustrates details of one embodiment of the present disclosure featuring a female electrode assembly (middle) having a female electrode element 634 with a female spring washer 632 that is fitted to a female electrode spring washer seating groove 633 that is positioned along the shaft of the female electrode element 634 and a female spring unit 630 that is normally compressed against the right side face of the female electrode spring retainer washer 632. Here, additional optional features include a female electrode receiving anvil 628 that corresponds to the mating surface of the optional male electrode centering point 626. Further optional features include embodiments in which the female electrode element 634 has an electrical coupling pin 614 that functions to provide an electrical connection between the female electrode 634, the (female) electrical coupling pin 614 and the electrical contact brush surface 635.

In further embodiments of the present disclosure, FIG. 6 illustrates some example of common spring washers 640, that can be used to secure the male and female electrode spring retainer washers 618 and 632, respectively, on the corresponding male and female electrode elements 620 and 634.

Alternative Gimballing Electromagnetic Coupler Module

Figure 7A:
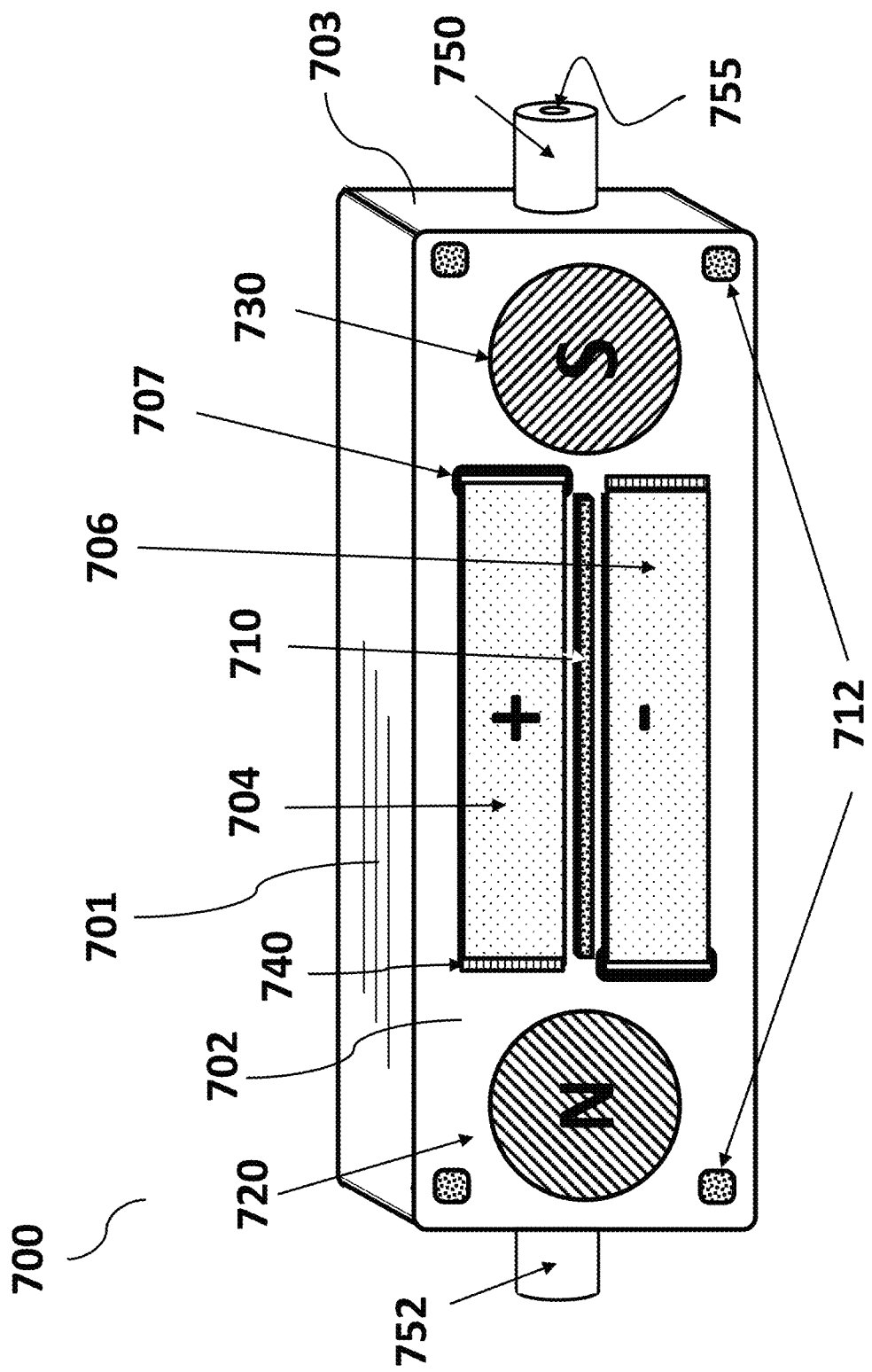
FIG. 7A, B show alternative embodiment of a gimballed normally open (NO) electromagnetic bar coupling module.
Figure 7B:
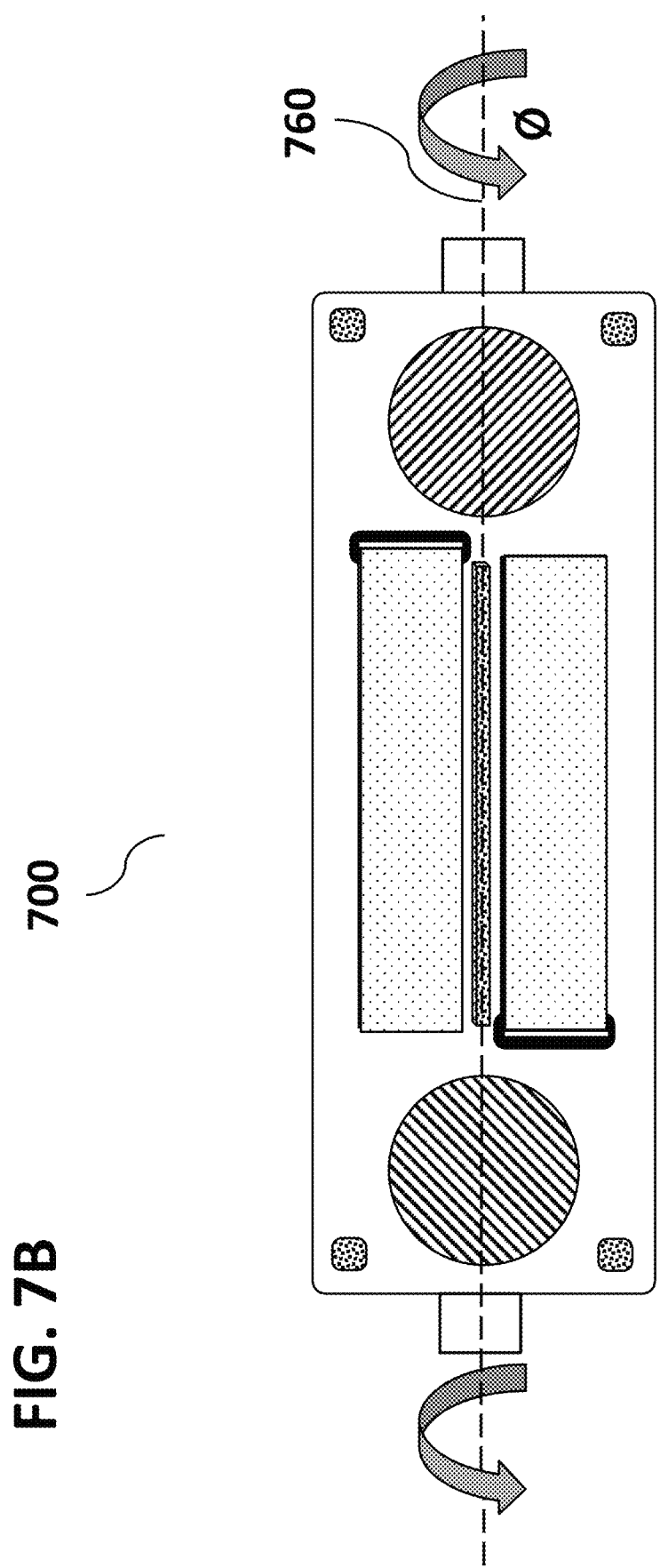

In another series of embodiments of the present disclosure, FIG. 7A illustrates a gimballed electromagnetic coupler module 700 that employs two oppositely faced magnetic attractive elements (720 and 730) aligned so that on one relative front side position the first magnet's north face (720) is directed perpendicular outward from the front surface 702 of the coupler module 700, while on an opposed relative front side position the second magnet's south face (730) is directed perpendicular outward from the front surface 702 of the coupler module 700. As shown in FIG. 7B, this configuration of two oppositely faced magnetic attractive elements in a parallel plane to that plane of the gimbal axis 760, about which the coupler module 700 swivels about, ensures that other respective coupling modules located along the outer edge of a floating solar pod module will attract to a similarly configured second coupler module 700 facing said first coupler module, with the north aligned face of a first magnet's north face 720 attracted to a third magnet's south face (730) of the second module, simultaneously with the second magnet's south face (730) of the first module attracted to a fourth magnet's north face (720) of the second module.

Figure 8A:
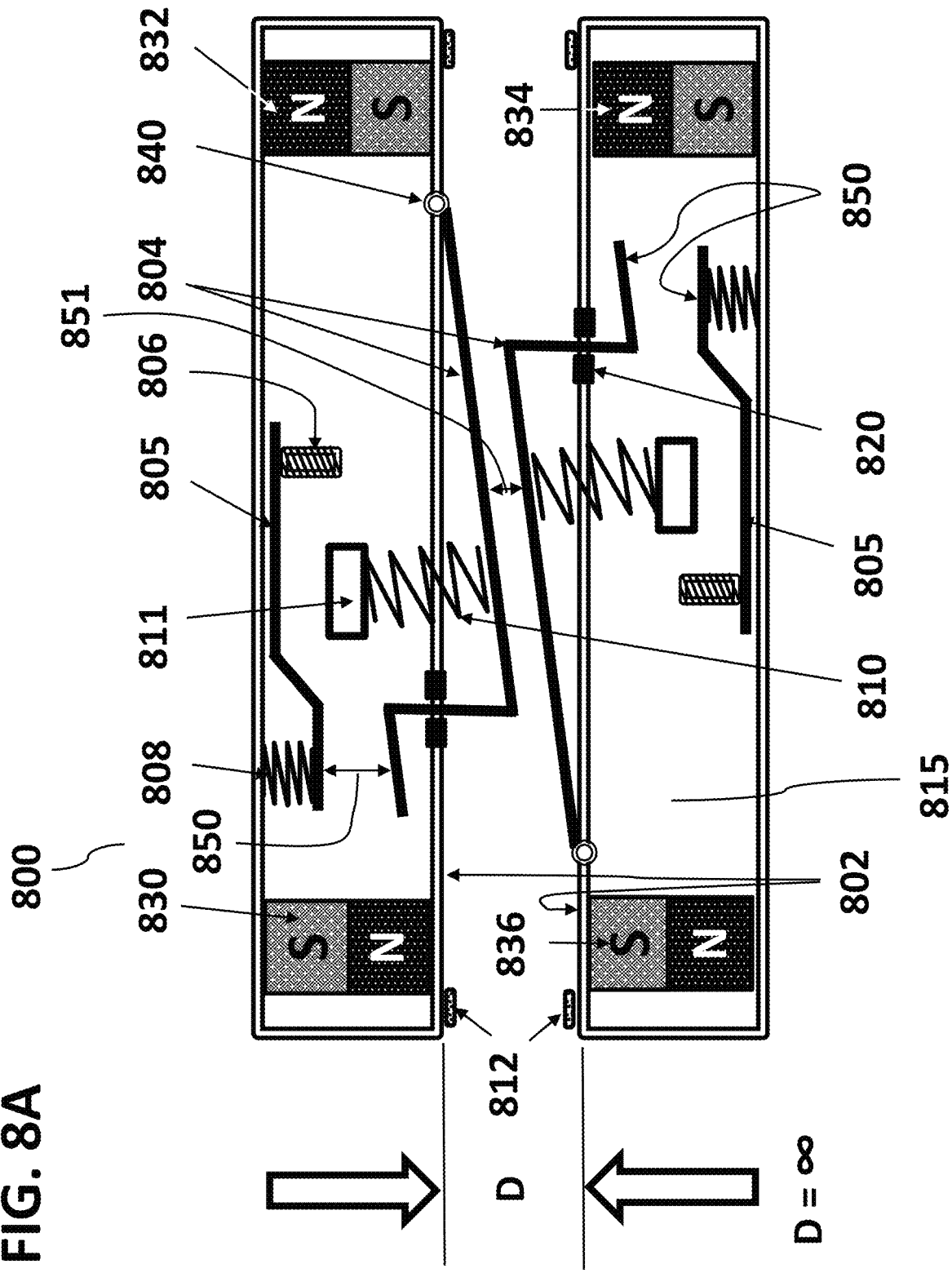
FIG. 8A, B and C show illustrations of two NO electromagnetic coupling modules first attracting (A), then engaging (B) and then mutually co-activating themselves and the opposing module (C) during an intercoupling event.

FIG. 7A also shows a gimballed electromagnetic coupler module 700 featuring a top side 701 extending to a front contact surface 702 and a both a right and left gimbal side surface 703 (only one side shown), the front contact surface featuring both a positive contact element 704 and a negative contact element 706. These may in one embodiment be in the configuration of relative flat electrodes or plate electrodes affixed to that front contact surface 702, or in alternative embodiments shown below, in the configuration of a articulating electrode element that is movable and engageable with an opposed electrode element when two gimballed electromagnetic coupler modules (700 and 700') are magnetically attracted to each other's front contact surfaces (702 and 702'). With movable or articulating electrode elements, a contact element grommet 707 functions to seal (from water, moisture, dirt) the opening on the front contact surface 702 through which the electrodes pass and ensure the smooth slidingly and reduced frictional movement of the electrode elements, as shown in more detail hereinbelow. A center bumper 710 is an optional element to ensure the proper spacing between two adjacent coupled coupler modules to prevent over-depression of the electrodes during engagement, as well as a plurality or four optional corner bumpers 712. The gimballed electromagnetic coupler module 700 features a first magnet 720 with north pole facing outward and a second magnet 730 with south pole facing outward from the coupler module front surface 702, the two magnetics located on a plane that is perpendicular to the swivel or gimbal axis 760 shown in FIG. 7B, with the coupler module 700 featuring a gimbal cylinder mount (750, Right side) and an opposing gimbal cylinder mount (752, Left side), both of which may optional bear a gimbal cylinder fastening element 755 on an outer face to enable physical and optionally an electrical contact for the coupler module mounted by means of the fastening elements 755 right and 755 left (not visible) which enable the coupler module 700 to swivel or gimbal about that axis 760, particularly during a coupling maneuver or when two coupler modules (700 and 700') are magnetically engaged by means of opposing magnetic attraction and are moving or being angularly displaced with respect to one another by some displacement angle, theta (Ø). FIG. 8A shows two normally open (NO) bar modules 800 from a top and internal component stylized viewpoint, present together in an opposed configuration with both front contact surfaces 802 facing on another and still separated by a distance "D", noted as infinity at just the distance D wherein the opposed magnets start to fell a mutual attraction for each other, resulting in the relative movement between the two modules 800 towards one another as a result of said magnetic attraction of the dual magnetic elements. It is noted that that North and South facing magnetic elements are configured so that the opposite pole of one magnet aligns with the coupling magnet. FIG. 8A shows an external contact element 804 which is a compound electrode that is hinged on one side using a contact element swivel joint 840 that is located on a front contact surface 802 of module 800 and which features an separation distance 851 outside between their outer contact surfaces.

FIG. 8A also shows two internal contact elements 805 having optional electrical terminal posts 806 for electrical connectivity. Both an internal contact spring 808 attached to the inner electrode 805 and optionally affixed to an appropriated located inner side surface and an external contact spring 810 attached to a Spring Retainer 811 and to the external contact elements 804, individually and collectively act to springily engage their respective electrode and contact elements, the spring force acting on them having sufficient strength to keep the two pairs of external contact elements 804 and internal contact elements 805 physically separated and electrically decoupled with respect to each other and each respective set of the two contact elements in the respective first and second normally open (NO) bar modules 800. Optional corner bumpers 812 act to prevent over compression of the two external contact elements 804, the thickness of the corner bumpers each being approximately equivalent to, or larger than the thickness of the contact elements 804. Here the contact element grommet 820 is show which enables the external contact element 804 to slide in and out of the front contact surface 802 through an appropriately sized opening into which the grommet 820 element fits and is engaged, and through which grommet 820 the contact element 804 can move freely while the grommet provides protection of the inner volume 815 of the bar module 800 from external exposure to water, moisture and dirt.

In FIG. 8A, it is seen that a First Magnet 830 having its north pole directed toward the front contact surface 802 is attracted to the opposed fourth magnet 836 located on the to be coupled second (lower) bar module's front contact surface 802, while simultaneously, the second magnet 832 with its south pole directed toward the front contact surface 802 is attracted to the opposed third magnet 834 located on the to be coupled second (lower) bar module's front contact surface 802, the combination providing a dual magnetic attractive capability. It is to be noted in these embodiments is that the North and South magnetic pole arraignment acts to prevent the coupling of adjacent bar modules 800 in which the position of the lower bar connector element is opposite to that shown in FIG. 8A, in other words if the lower bar connector element was reversed from left to right, the opposed magnetic poles would be N to N and S to S, providing sufficient magnetic repulsion to prevent the misaligned or inverted couplers to approach one another and couple. This is an important safety feature to prevent the false or reverse electrical connection that would otherwise occur with a single magnetic attractive element, as symmetry only enables properly aligned adjacent bar modules (800, 800') as shown in FIG. 8A to be magnetically attracted to each other to enable further movement towards one another and eventual full electrical coupling to occur between the said modules.

At the relative position as shown between the two bar modules (800, 800') both the internal contact gap 850 and the exterior contact gap 851 is sufficiently large so as to prevent electrical contact or arcing of current between the electrodes, providing a "normally open" (NO) default electrical state which prevents energization of the internal (805) and external (804) contact elements with each other, and simultaneously provides a second NO default electrical state in any second or opposed bar module.

FIG. 8B illustrates the state in which the two bar modules (800, 800') have been properly attracted towards each other, and the Relative separation (D) between the two 800 Modules has decreased sufficiently for the two respective external contact elements 804 of the upper and lower bar modules 800 to come into physical and therefor potential electrical contact, corresponding to a separation distance noted as Si≥0, corresponding to an initial contact distance separation (Si) defining the distance of first or initial contact of the opposing bar module's external contact elements 804.

It is to be noted that at this state of separation (D=Si), the two sets of internal contact elements 805 remain physically and electrically decoupled (not in contact) with the corresponding internal contact elements 804, the respective gaps 850 having decreased in distance with respect to their separation as shown in prior FIG. 8A. At this state, the two external contact springs 810 are at a position of initial compression as the two external contact elements 804 just come into first contact with one another and the exterior contact gap 851 distance is zero, while the internal contact gap 850 is still larger than zero so as to prevent internal energization of the internal contact elements 805 with the inner portions of the external contact elements 804.

In FIG. 8C, the two normally open bar modules (800, 800') have come into further contact, with the relative separation between the two modules, D, being reduced to Sf, (final distance of separation) which can optionally be equivalent to the length equivalent to 2T or twice the thickness, T, of the exterior or outside portion of the external contact elements 804. At this state, the two modules 800 have been magnetically attracted to one another and have achieved a position of closest approach or coupling, in which the external contact elements 804 remain in direct physical and thereby also electrical contact, and the optional corner bumper 814 elements are in direct contact, acting to prevent any further approach of the two modules 800 and any over compression of the external contact elements 804 against each other and prevent any over compression of each external contact element 804 against the corresponding front surface 802 of the module 800. In related embodiments, one or a plurality of corner bumpers 812 (as well as one or a plurality of center bumper 710 elements, located either at the center of the front contact surface 802 or elsewhere or said surface) can individually or collectively be separate elements attached to said front contact surface 802 or be formed on said front contact surface as a molded or additive protrusion extending outward from said front contact surface.

In FIG. 8C it can be seen that at this state of separation (contact distance, D=Sf) that the internal contact elements 805 have now come into complete physically and therefore electrical contact with the corresponding interior portion of the external contact elements 804, the distance of separation 850 now being zero (in direct contact, no gap). At this state, the opposed sets of magnets have also achieved there closest position of approach to each other, further approach being prevented by either the contact between the optional corner or center bumpers, or by contact and compression of the two external contact elements 804 against the front contact surfaces of the respective bar modules 800, reducing the internal contact gap 850 to zero distance, or no separation between them. At this state, the two external contact springs 810 have also become compressed to a maximum state, continuing to exert an outward spring force that will act to reset the position of the external contact springs if the respective bar modules 800 become disengaged or decoupled from one another. At this state, it is also to be noted in FIG. 8C that the internal contact springs 810, which may also be optional in related embodiments, may now be very slightly compressed by the contact of the internal contact elements 805 acted upon by the relative inner directed movement of the external contact element 804 into the final position and state of separation as shown in this figure.

In the embodiments of the present disclosure as shown schematically in the series of FIG. 8A-C, it is seen that the two adjacent normally open (NO) bar modules (800) will, when positioned or when coming into a relative position as shown in FIG. 8A, first experience magnetic attraction between the complementary and north/south pole opposed set of magnets (830 and 836, and 832 and 834, respectively) at a relative distance of separation, D, of some value, denoted Da, or distance of attraction, that is just slightly less than infinity, being a distance of separation at which there is insufficient magnetic attraction to act to move the bar modules (800) towards each other. At this distance of first attraction, the two bar modules remain physically and electrically separate and disconnected, not having engaged in any manner other than the first onset of magnetic attraction being experienced between them. At a closer distance of separation as shown in FIG. 8B, the distance D is then equal to Si, wherein Si≥0, corresponding to an initial contact distance separation (Si) defining the distance of first or initial contact of the opposing bar module's external contact elements 804. At this state it is noted that the internal contact elements 805 remain separated from the external contact elements 804, separated by a distance corresponding to the internal contact gap 850, which is essentially unchanged from that gap distance as shown in FIG. 8A, as little or no compression forces have yet acted to overcome the spring tension of the external contact spring 810, so that while the external contact elements 804 have just come into contact, they have not yet moved inward at this state of separation.

Finally, as seen in FIG. 8C, the two complementary bar modules have moved to the closest position of approach, the external contact elements 804 remaining in close contact and at this state of separation the optional corner bumpers 812 and/or optional center bumper (see 710, or variants as discussed herein) are in contact with the opposing elements on the opposed face of the second bar module so as to prevent further approach and compression or force on the external electrodes 804. Further, at this stage, the two sets of internal contact elements 805 have now come fully into contact with an interior portion of each of the two exterior contact elements 804 so as to be in physical and electrical contact with their respective contact element, resulting in the dual normally opened electrical configuration of the two engaged and coupled bar modules 800 to be in an electrical state in which both the internal and external contact elements are all in physical and electrical contact, enabling the flow of current and electricity through the coupled bar modules.

At the state of configuration as shown in FIG. 8C, the coupled bar modules 800 remain fixed in position with respect to one another, the combined dual magnetic attractive forces as well as friction (side to side, bottom to top and/or tangential) induced from the contact area spanned by the front contact surface 802 between the respective front surfaces and any optional corner bumpers and/or center bumpers or other offset bumpers or similar features located and positioned similarly on the front contact surface 802 of the respective bar module 800. Further, the rotational symmetry of the opposed and coupled bar modules 800, with respect to a center axis normal to their respective front contact surfaces ensures the proper alignment of the external contact elements, and the correct electrical polarity being maintained, the magnets, and any bumpers or similar features added to aid separation distance. The presence of the contacts and bumpers also combine to create a frictional area that aids in maintaining the relatively fixed position between the opposed and coupled bar modules 800 in operation when they are present on a solar pod device, where the solar pods are floating on water and subject to consequential motion induced by waves and currents present on and within the water body on which the coupled solar pods are present.

Figure 9:
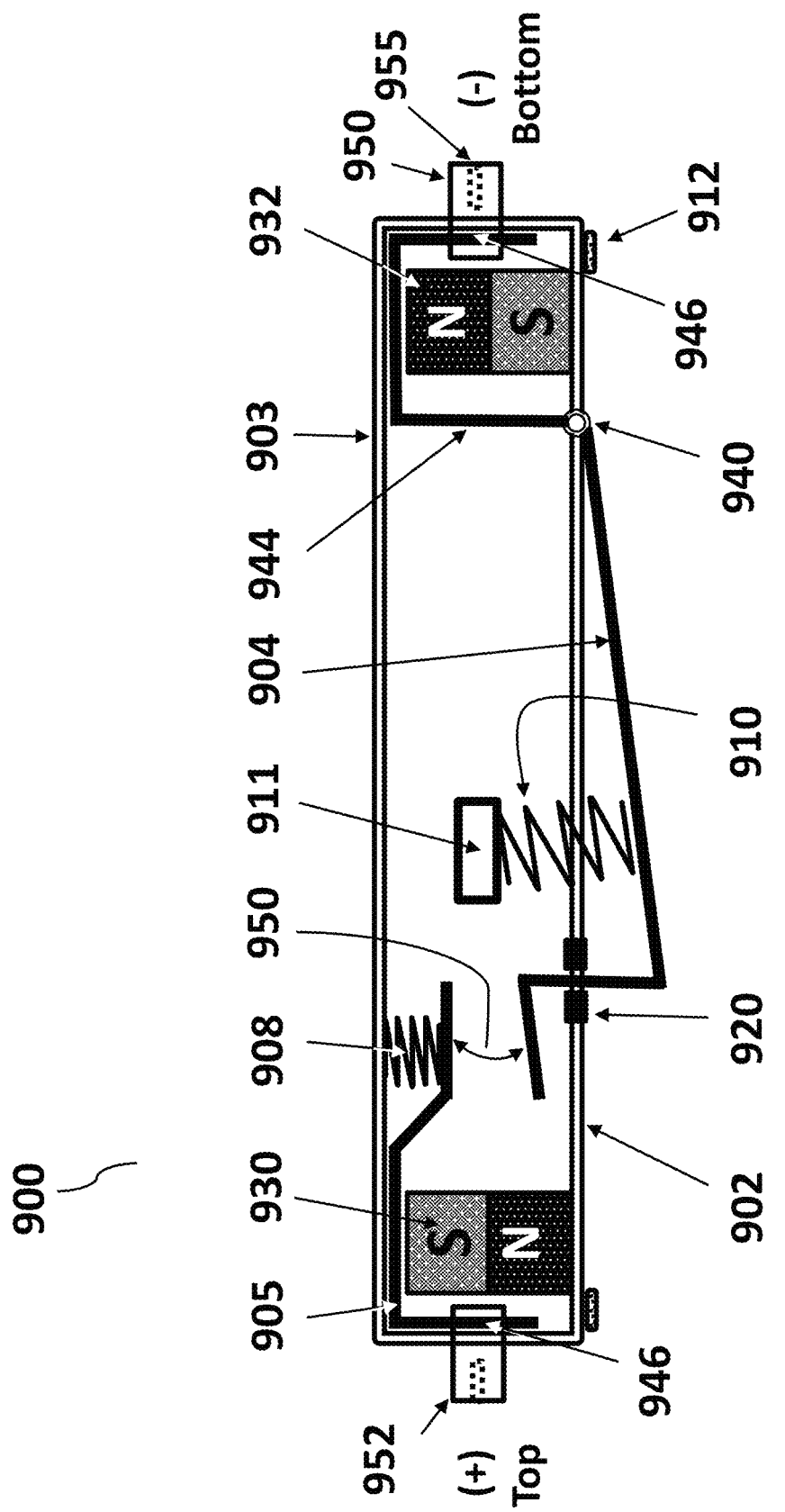
FIG. 9 shows an embodiment of a NO electromagnetic coupling module with an electrically conductive gimbal mounting option.

FIG. 9 shows another embodiment of a gimballed NO bar module 900. In this embodiment, the front contact surface 902 features include similar elements to prior embodiments, but the internal configuration of the internal contact element 905 differs in that one end of the contact element is electrically coupled or connected to at least one gimbal cylinder mount for the purpose of electrical communication and transfer/passage of current or electricity between these elements, so that the external gimbal cylinder mounts can be used to couple the bar module 900 to a separate negative or separate positive electrical grid associated with the solar pod module to which this embodiment of the bar module 900 is attached.

FIG. 9 shows a gimballed NO bar module 900 with a front contact surface 902 opposing a rear surface 903 that is free of any electrical contact elements. The bar module 900 features an external contact element 904 that is attached to a contact element swivel Joint 940 that provides rotational swiveling motion capability to 904 and also enables electrical contact between 904 and an external contact terminal Lead 944, which is configured to attach or connect to an electrical coupling element 946 located inside the bar module 900, and which connects to the gimbal cylinder mount (R) 950 as illustrated on the right side of FIG. 9.

In this embodiment, an internal contact element 905 is also attached to a separate physical and electrically linked electrical coupling element 946 located inside the bar module 900, which is attached to a gimbal cylinder mount (L) 952, which enables electrical connectivity between 905 and the external 952. In this particular embodiment, the internal contact element 905 is back-surface supported by an optional internal contact spring 908 to prevent over compression when engaged by an inner portion of the external contact element 904 which come into contact with each other when the contact element 904 is compressed inward by means of an opposed second gimbaled NO bar module 900' coming into face-to-face alignment with each other as in the prior embodiments disclosed hereinabove.

In FIG. 9, an external contact spring 910 maintains tension between a spring retainer 911 and the external contact element 904, while enabling outside applied force or movement applied to 904 to overcome the tension exerted by 910 in order to compress and move 904 inward when an opposed bar module 900 is engaged face to face with the front contact surface 902 of the bar module 900. In this embodiment, the other internal components, including a first magnet 930 and a second magnet 932 with the magnetic poles aligned as illustrated are present, including a contact element grommet 920 as in prior similar embodiments. Here, the right and left gimbal cylinder mounts (950, 952) are thus electrically connected to the external contact element 904 and the internal contact element 905, respectively, serving to isolated either one of either a top or bottom positioned external contact element. Note that in the schematic illustration presented in FIG. 9, only the top positioned internal and external contact elements are shown, the bottom set are not illustrated in the figure for reasons of clarity. In this particular embodiment in FIG. 9, the right side gimbal cylinder mount 950 is deemed to be the negative electrode or negative circuit connection, while the left side gimbal cylinder mount 952 is deemed to be the positive electrode or positive circuit connection, the gimbal cylinder mounts enabling the physical rotation or swiveling of the bar module 900 about the gimbal (swivel) axis 760 as illustrated in FIG. 7B. The two gimbal cylinder mounts (950, 952) may be physically and electrically connected and supported by an opposed pair of physical and electrical receptors located on a solar pod module connecting to both sides of the bar module 900 by means of the opposed gimbal cylinder fastening elements 955 that hold the gimbaled NO bar module 900 in place, which in this example embodiment is a machine screw bored receptive element that is threaded to receive a retaining screw or bolt that enables some rotational movement about the rotational axis of the bar module 900, but acts to physically secure said bar module to a receptive edge of a solar pod and simultaneously provides a means to electrically couple one or more of the internal and external contact elements to an electrical array or electrical connection located on a solar pod.

Figure 10:
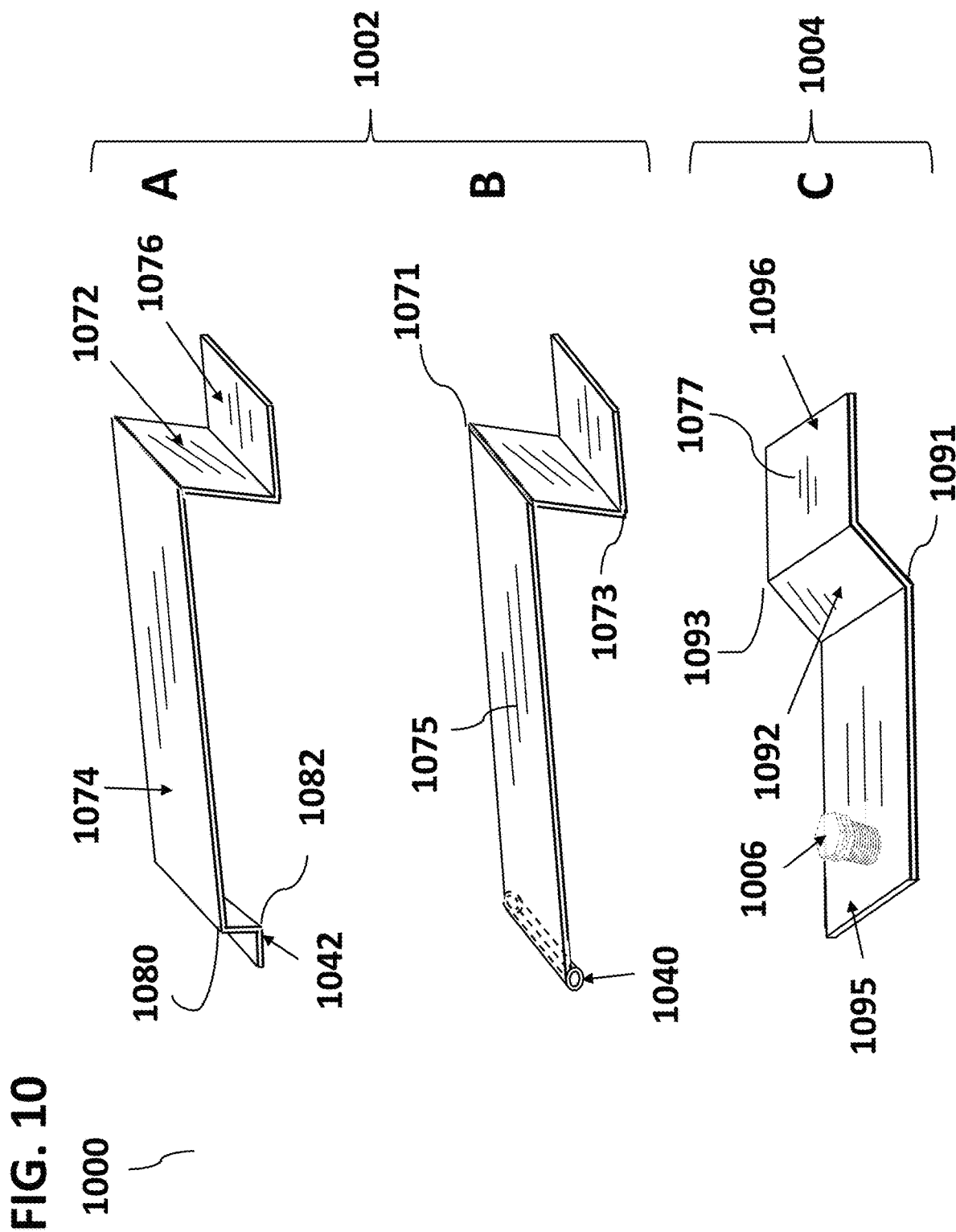
FIG. 10 shows details of the internal and external contact elements of NO bar coupling modules.

FIG. 10 shows some inventive embodiments of the contact elements 1000, including external contact elements 1002, examples A and B. Here, example embodiment A features an external contact portion 1074, which presents a wide array for electrical contact on its upper face as shown. Bends in the external contact element provide a configuration that enables the external contact elements to pivot, with a sweep portion 1072 that is either straight or slightly curved (see embodiment 1104 in FIG. 11) and of sufficient length to allow the external contact elements to slide into and out of the gimballed bar module's housing, optionally through a sealing grommet configured to accommodate the contact element's motion and restrict the entry of water. In embodiments A and B, a first inflection elbow 1071 forms the sweep portion 1072 of the external contact elements 1002, which is the portion that moves through the optional sealing grommet to enable the lower face of the internal contact portion 1076 to make electrical contact with the internal electrical contact surface 1077 of the internal contact element 1004 when mounted in the module housing, the second inflection elbow 1073 being in the opposite direction to form the internal contact portions 1076 of 1002 A and B. In embodiment A, a distal fold (left side) at a third inflection elbow 1080 and a fourth inflection elbow 1082 in the opposite direction form the contact element pivot portion 1042, which enables the external contact element 1002A to be retained by a correspondingly shaped slot on the face of a gimballed NO module and yet enable the inward and outward swiveling motion of the external contact element 1002A as illustrated in the progression of FIGS. 8A-8C, as opposing gimballed NO modules come into magnetic attractive range and subsequently couple together. In an alternative embodiment 1002B, the distal end (left side) of the external contact element features a contact element swivel joint 1040, which in this example is one element of a hinge or hinge-like coupling which would couple via a securing pin to a corresponding hinge or hinge-like coupling located on the gimbaled NO module and in electrical contact with an external contact terminal lead 944 (see for example FIG. 9). The contact element swivel joint 1040 thus acts a swiveling module physically securing the external contact element 1002B and also providing an electrical connection between 1002B and an external contact terminal lead 944.

In FIG. 10, example embodiment C of an internal contact element 1004 is shown, featuring an electrical terminal post 1006 located on the internal contact terminal portion 1095, which enables the attachment of an electrical lead or connection to 1004. The internal contact element 1004 features a first inflection elbow 1091 at an approximate 45° angle with respect to the external electrical contact surface 1077 of the internal contact portion 1096. This inflection elbow angle may vary based on the configuration of the other electrode portions, and can also in other embodiments be flat, so that angles of between 0° to 90° are also acceptable. Further, this embodiment features a first inflection elbow 1091 that forms an angled sweep portion 1092 between a second inflection elbow 1093 that forms the external electrical contact surface 1077 portion of 1004C which makes contact with the lower side (internally facing) internal contact portion 1076 of the external contact elements 1002. In operation when positioned within an inventive gimbaled NO bar module 900 as illustrated in FIG. 9, the upper surface or external electrical contact surface 1077 of the internal contact portion 1096 of 1004C contacts the lower contact surface or the lower face of the internal contact portion 1076.

Figure 11:
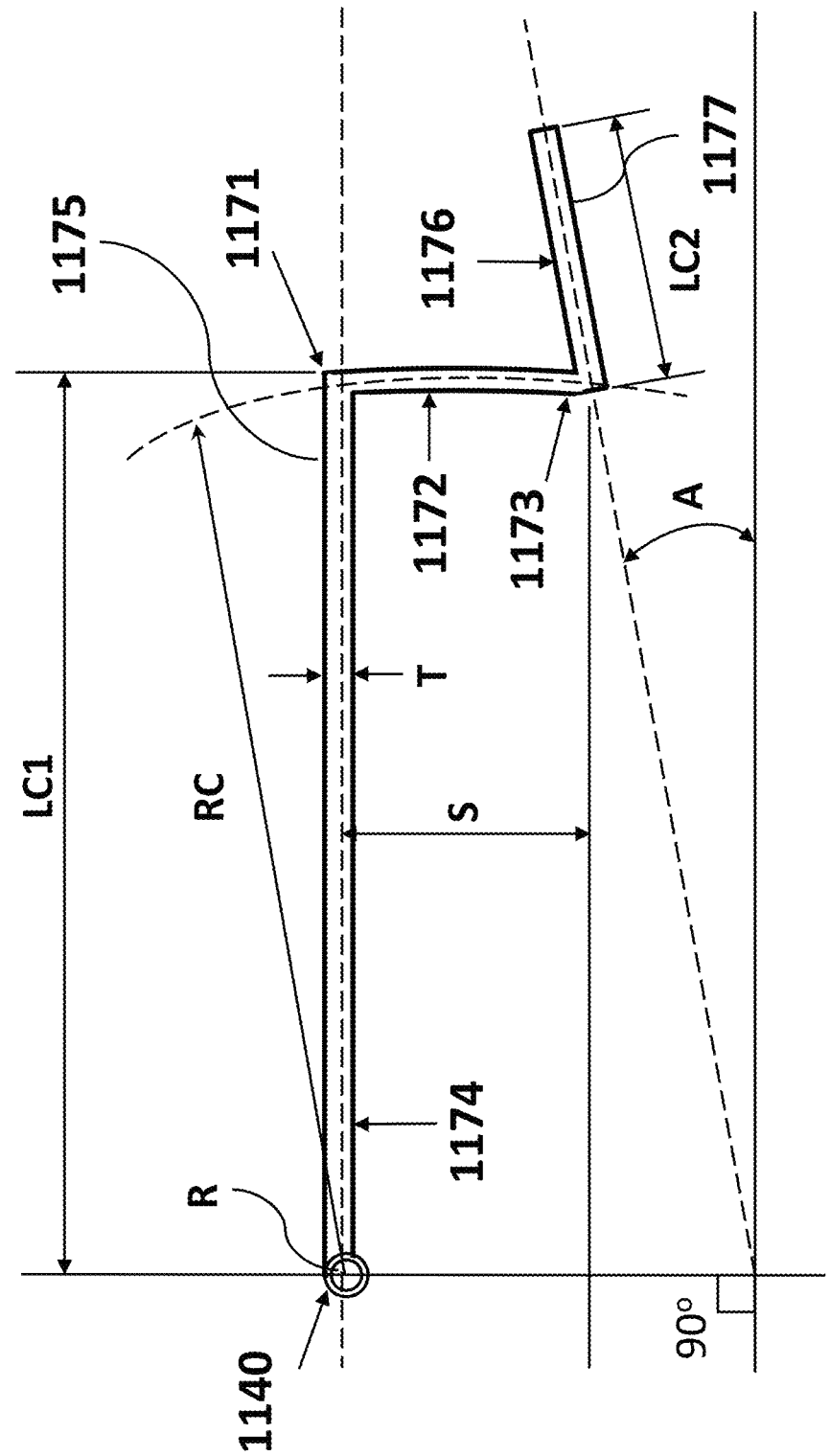
FIG. 11 shows a detailed view of an external contact element bearing a hinged-style connection means.

FIG. 11 shows a cross-sectional view of one embodiment of an external contact element 1104 as shown in FIG. 10 as 1002B. The length of the external contact portion is represented as LC1, measured from the center of radius or pivot point R of the contact element swivel joint 1140 to the first inflection elbow 117. The length of the internal contact portion is represented as LC2, measured from the second inflection elbow 1173 to the terminal end of internal contact portion 1176 of the external contact element 1104. The sweep portion 1172 of 1104 may be slightly curved along a radius RC as shown in some embodiments as illustrated in FIG. 11, being arcuate so that when the external contact element 1104 swivels about the center of radius R pivot point, the sweep portion 1172 maintains a constant difference of separation with respect to the top horizontal dotted line shown passing through 1140 and 1171 which represents the external electrical contact surface 1175 of 1104, so that the sweep portion 1172 maintains a constant aspect with respect to a sealing grommet through which it moves inward and outward while swiveling about the contact element swivel joint 1140. By making the sweep portion 1172 arcuate, a watertight seal around this portion can be better achieved at rest and when it is in motion during an inter-coupling action between two external contact elements 1104 located on different gimballed bar modules. A is the internal contact portion angle, S is the contact travel distance of throw distance, T is the contact element thickness. The angle A is dependent on the length LC1 and S, and generally has an angular value of between 0° to 45°, as required by the selected configuration so that the internal electrical contact surface 1177 of a first external contact element 1104 is brought into a proximate or intimate parallel contact with the receptive external electrical contact surface 1175 of a second external contact element 1104' (not shown here, but see FIGS. 8A-C) upon a swiveling motion of either or both 1104 and 1104' about their respective centers of radii R and R', respectively. The thickness T of the external contact element 1104 may vary, but depending on the material employed, should be of sufficient thickness to prevent significant bending or distortion of the external contact element during use, and also of sufficient thickness and width, W (not shown, but being the cross-sectional width), to enable the desired electrical current flow of the desired or maximum amperage through the elements without overheating them.

Additional alternative embodiments adding ribbed or textured surface features to the electrical contact surfaces of the various contacting elements disclosed herein can also provide for greater surface areas, aid in the alignment of connecting elements, prevent slippage or relative movement when engaged and other benefits not enumerated here.

Figure 12:
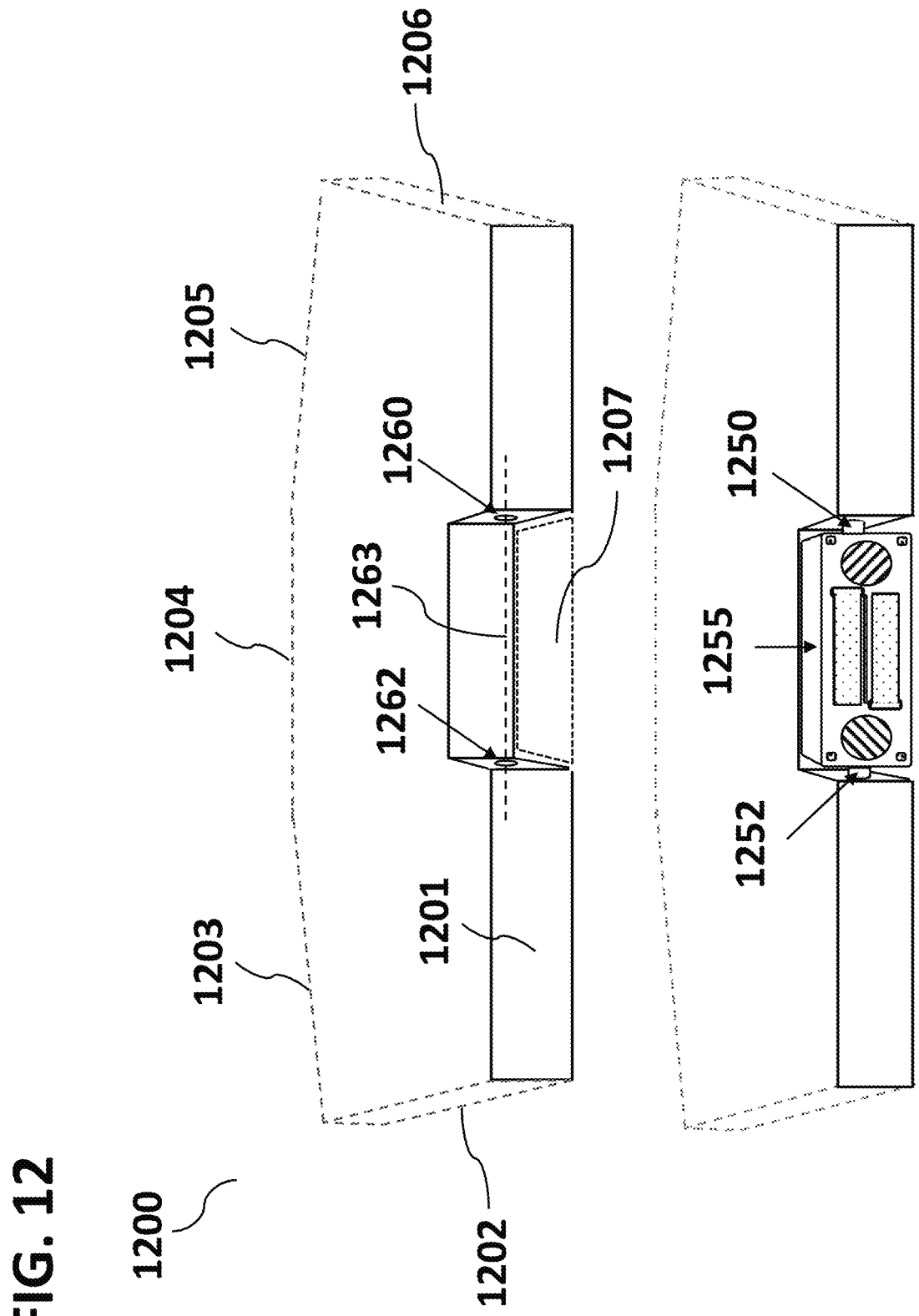
FIG. 12 shows a perspective illustration of a floating hexagonal solar pod with a NO bar coupling module placed in one proximate edge of solar pod.

FIG. 12 shows an illustration of one embodiment of the present invention featuring a hexagonal shaped solar pod 1200 with a receptive port along a first edge region 1201 that can accommodate a gimbaled NO bar module 1255 within a cutout region 1207 (indicated by the smaller dotted lines outlining a rectangular opening therein) located approximately center and midpoint on the face of the first edge region 1201. The gimbaled NO bar module 1255 is shown secured in the lower illustration, a left gimbal cylinder mount 1252 engaging a receptive left gimbal connection port 1262, and a right gimbal cylinder mount 1250 engaging a receptive right gimbal connection port 1260, the elements 1250, 1252, 1260, and 1262 all being aligned along the pivot or gimbal axis 1263 shown by the dotted line in the upper illustration, and being the axis about which the gimbaled NO bar module 1255 pivots, enabling it to rotate sufficiently to maintain electromagnetic contact with a corresponding NO bar module 1255' (not shown) on an adjacent solar pod 1200' similarly configured.

Each of the other five faces of the hexagonal shaped solar pod 1200 may be similarly configured with a gimbaled NO bar module, so that any one of the first, second, third, fourth, fifth and sixth edge regions (1201, 1202, 1203, 1204, 1205 and 1206, respectively) are able to electromagnetically couple to any one edge region or face of another adjacent solar pod 1200' during operation when floating on the surface of a body of water or on a static surface, such as when two or more solar pods are deployed on land and placed adjacently in proximity together within range to enable the respective electromagnetic coupling modules or gimbaled NO bar modules to couple.

Figure 13:
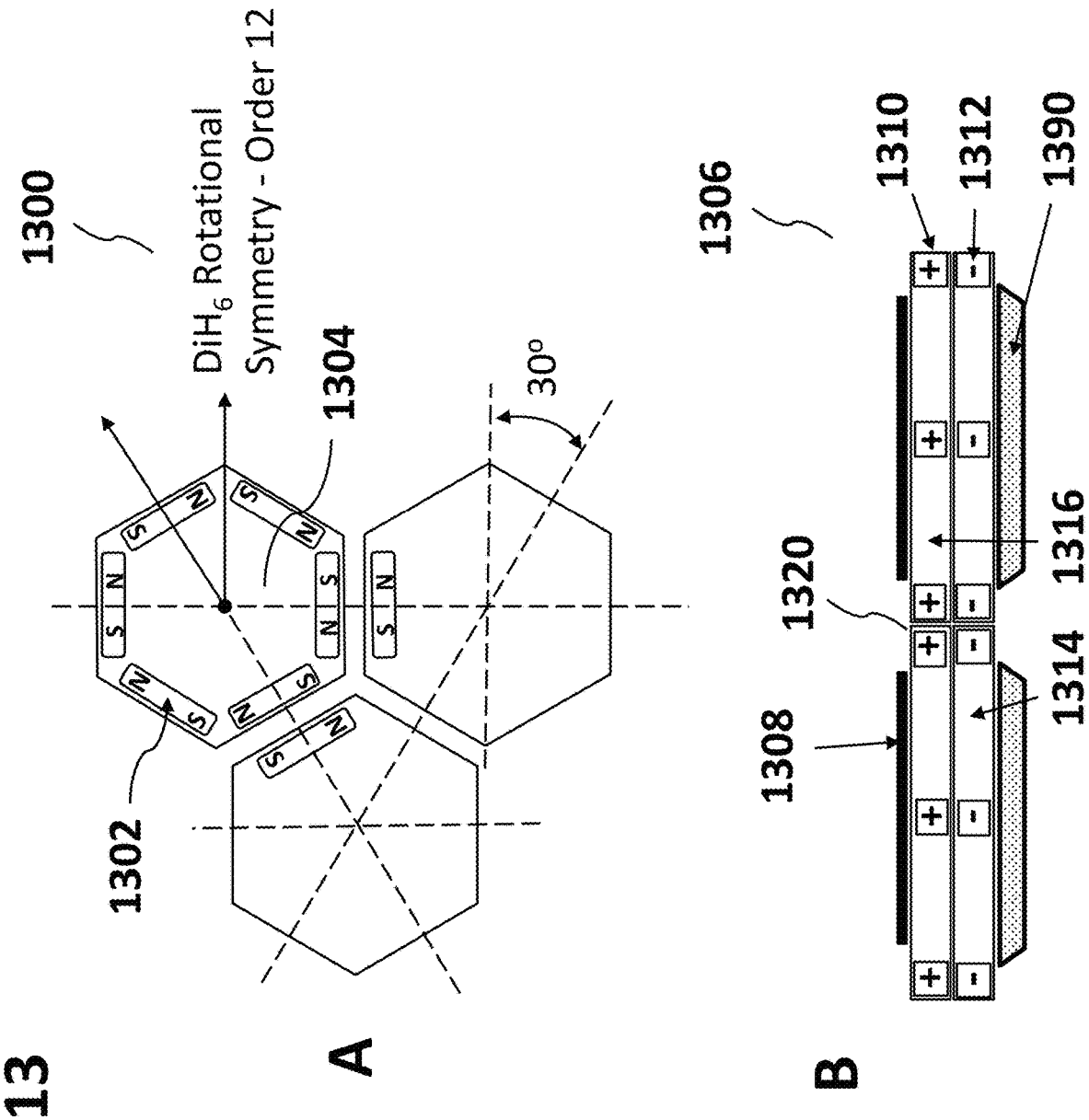
FIG. 13 shows a top illustrative view representing the magnetic coupling poles and configuration of three adjacent solar pods bearing a plurality of NO bar coupling modules along their periphery.

FIG. 13 illustrates the manner of intercoupling between adjacent hexagonal shaped solar pods or 'hexapod' 1300 from a top view perspective A, in which two of the six magnetic gimbal modules 1302 on a first (upper right) hexapod are coupled to corresponding magnetic gimbal modules located on a second (left) and third (bottom) hexapod as shown in the top illustration A. Only the magnetic pole of the respective gimbal modules 1302 are shown for clarity to illustrate that the symmetry of placement of the magnets only enables coupling of a correctly positioned hexapod to an adjacent hexapod.

During property operation and orientation of the hexapods, it is seen that the North and South magnetic poles of a first magnetic gimbal module 1302 may be brought into attractive proximity and then magnetically couple to opposed South and North magnetic poles, respectively, of a corresponding second and third gimbal modules 1302', 1302" on the outer faces or edges of a second and third hexapod as illustrated, the north and south magnetic poles being magnetically attracted to one another.

If a hexapod is inverted, the inverted hexapod's north and south magnetic poles are reversed from those shown in FIG. 13 and will cause a north pole of a first magnetic gimbal module 1302 to face a repulsive north pole of a second magnetic gimbal module 1302' and a south pole of that first magnetic gimbal module 1302 to face a repulsive south pole of that same second magnetic gimbal module 1302', thus providing a double repulsive magnetic force that prevents the intercoupling of a hexapod with an improperly inverted second hexapod. This inventive configuration as disclosed and described in the various embodiments of the magnetic modules herein prevent an inverted solar pod from improperly coupling into an assembled array of properly positioned (upright) solar pods and causing an undesirable electric short or cross-connection. A solar pod, such as the hexapod 1300 shown is correctly oriented when its top surface bearing a hexagonal solar panel region 1304 faces upward, positioning the solar panels mounted within this region to face upward in the direction of incident solar light.

The lower illustration B shows a side view of an hexapod (or any solar pod) intercoupling schematic 1306 illustrating a first solar pod on the left coupled to a second solar pod on the right by means of two adjacent gimbal or magnetic modules 1302 each located on a separate pod (here a left and right hexapod) coming into magnetic and electrical contact with each other in the electrical coupling region 1320 located between the two coupled hexapods. Each of the magnetic gimbal modules 1302 have an upper or top positive (+) electrical contact 1310 and a lower or bottom negative (−) electrical contact that couple, forming a first positive-positive connection and a second negative-negative connection between adjacent solar pods. The top electrical contact 1310 is in electrical communication with the positive electrical array 1316, which functions to connect each individual magnetic gimbal module 1302's top electrical contact 1310 into electrical communication with each and every additional magnetic gimbal module 1302"s top electrical contact located on adjacent solar pods, and thus enable two or more coupled solar pods to establish a positive electrical array between them when properly coupled.

In a similar manner, the bottom electrical contact 1312 is in electrical communication with the negative electrical array 1314, which functions to connect each individual magnetic gimbal module 1302's bottom electrical contact 1312 into electrical communication with each and every additional magnetic gimbal module 1302"s bottom electrical contact located on adjacent solar pods, and thus enable two or more coupled solar pods to establish a negative electrical array between them when properly coupled. Accordingly, an extended top positive electrical array that is electrically independent from a second extended bottom negative electrical array can be formed by coupling between two or more adjacent solar pods.

As shown in FIG. 13B, a bottom floatation element 1390 serves to provide buoyancy to each individual solar pod and to position the corresponding gimbal modules 1302 so that they are above the water line when the solar pods are deployed on the surface of a body of water. Here, the hexagonal solar panel region 1304 bears a top solar panel 1308.

When deployed on the surface of a body of water that may move due to wave and current action, or another surface that is not necessarily flat or perfectly horizontal, the gimbaled nature of the corresponding magnetic gimbal module 1302's enable adjacent solar pods to electrically and magnetically couple even when they are not co-planar with respect to one another when coupled and tiling a surface.

FIG. 14 shows representative embodiments of two pairs of intercoupled solar pods featuring a plurality of electromagnetic coupling modules located on the outer periphery or edge region of two adjacent solar pods that are magnetically and electrically connected together and illustrated as floating on the surface of a water body, having waves with crests of various heights represented by letters A, B and C. In the upper trace, adjacent solar pods, a first and second, 1400 and 1402 respectively, are intercoupled by means of one of the embodiments of an electromagnetic coupling module according to the present disclosure and are illustrated as floating on a water surface with small and medium wave crests A and B moving under the solar pods. Under these conditions, the relative motion of the solar pods as the wave action displace them in an upward and downward position relative to a horizontal plane (shown as a dotted line) parallel to the normal surface plane of the water.

With small and medium waves, the displacement angle, theta (Ø) is generally small, varying between about 10° and −10° as the respective modules dip and bob on the water surface with wave action acting upon them. In the lower traces, adjacent solar pods, a third 1403 and fourth 1405, are coupled and solar pod 1405 experiences a larger wave C, causing it to rise upon the crest of wave C and temporarily adopt a larger angular displacement with respect to its coupled solar pod 1403 yet still maintain a state of effective electromagnetic coupling between the two solar pods, i.e. the electromagnetic coupling modules remain magnetically and electrically connected during the displacement motion. In an array of multiple solar pods adjacently coupled in two dimensions forming an extended tiling on the surface of a water body, the presence of four or more coupling edges (e.g. solar pods in polygon shaped configuration with polygons having 4, 5, 6 or more sides) provides sufficient adaptability and range of motion for a plurality of interconnected solar pods to remain electromagnetically coupled despite the action of waves and currents. Naturally, upon a large displacement or disrupting event, the solar pods can safely decouple to prevent damage to themselves and other solar pods, automatically being attracted to and recoupling with adjacent solar pods when random motion brings two or more uncoupled faces of two adjacent solar pods into sufficient range so as to cause mutual attraction between the respective magnetic coupling elements to result in recoupling and reestablishing of an interconnected solar pod array and corresponding electrical grid formed by the interconnected array of solar pods employing one or more of the inventive embodiments of the electromagnetic coupling modules disclosed herein.

Depending on the configuration, the gimbal may provide for effective coupling between adjacent pods even when displaced relative to one another by a relative displacement angle theta (Ø) of between −45° and 45°, or alternatively between −30° and 30°, or alternatively between −20° and 20°, or alternatively between −10° and 10°, or alternatively between −5° and 5°, the angle being defined with respect to the plane shown by the horizontal dotted line in FIG. 14.

In operation, an extended array of floating solar pods physically connected by means of the inventive electromagnetic coupling modules disclosed herein tend to suppress wave action to some extend, the strength of the magnetic elements being employed being selectable to provide lesser or greater intercoupling forces so that the modules may be more easier or less easily separated, respectively, by wave force or other forces that otherwise would displace them or separate them from one another during deployment on the surface of a body of water.

Materials of Construction

The electrodes, connectors and components of the various embodiments disclosed herein of the inventive electromagnetic coupling modules can be constructed of any suitable conductive material, such as metal, alloys, composites and the like capable of carrying electricity and constructed to bear the desired electrical currents anticipated to be transmitted through them and through inter-surface contacts. Some example metals include, but are not limited to, aluminum, brass, copper, gold, lead, platinum, silver, steel, tin, zinc, and some example alloys include, but are not limited to, alnico, brass, bronze, hydronalium, Inconel (an austenitic nickel-chromium-based superalloy), steel, stainless steel, and combinations thereof. To improve water-resistance, particularly in saline water bodies such as oceans and lakes with salt water intrusion, the conductive or contact surfaces of the electrodes, connectors and components of the inventive embodiments disclosed here can be protected by a coating of a more salt- and oxidation-resistant conductive metal, such as for example gold or platinum, or an alloy containing gold or platinum in combination with another metal that can be deposited, coated, electroplated or placed on the surface, and preferably at least on an electrical contact surface, of said inventive electrodes and connectors disclosed herein.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

The invention claimed is:

1. An electromagnetic coupling system comprising:
   (a) at least two electronic bar coupling modules;
      wherein said electronic bar coupling modules each have
      (1) a first external contact element;
      (2) a second internal contact element;
   (3) an external contact spring tensioning element;
      wherein said first external contact and said second internal contact elements are normally biased in an electronically open circuit configuration by means of said external contact spring tensioning element;
   (b) a first and second permanent magnet coupling element;
      wherein said permanent magnetic coupling elements each have a north pole and a south pole;
   (c) a gimbal mounting system;
      wherein said gimbal mounting system has a first left cylinder mount and a second right cylinder mount; and
   (d) a housing module;
      wherein said permanent magnetic coupling elements are located within said housing module; wherein a first south pole of said first magnetic coupling element faces outward toward a contact face of said electromagnetic coupling system;
      wherein an opposed first north pole of said first magnetic coupling element faces inwards;
      wherein a second south pole of a second magnetic coupling element and its north pole are situated adjacently on said contact face so that only one of said south poles and one of said north poles of said first and second permanent magnet coupling elements faces outward toward said contact face;
      wherein said housing module is located between the first left and second right cylinder mounts of said gimbal mounting system; and
   wherein said first left and second right cylinder mounts are opposed to one another and located on a first left side and second right side of said housing module
      wherein at least one of said first left and second right cylinder mounts are electrically in contact with a contact element selected from an internal contact element, external contact element, contact element swivel joint, and external contact terminal lead, and combinations thereof.

2. The electromagnetic coupling system of claim 1, wherein said first external contact element is anodic and a second external contact element is cathodic;
   wherein said first and second external contact elements are located adjacent one another in a parallel configuration in a first top position and a second bottom position, respectively;
   wherein said first and second external contact elements are situated on said contact face of said electromagnetic coupling system;
   wherein said first external contact element is located above a gimbal axis of rotation passing through said gimbal mounting system from said first left cylinder mount to said second right cylinder mount; and
   wherein said first top position and said second bottom position are opposed about a plane coincident with said gimbal axis and perpendicular to said contact face.

3. The electromagnetic coupling system of claim 1, wherein said housing module bears one or a plurality of bumper elements on a front contact surface of said housing module.

4. The electromagnetic coupling system of claim 1, wherein said housing module bears one or a plurality of contact element grommets through which slidingly engage each of said external contact elements.

5. The electromagnetic coupling system of claim 1, wherein said housing module features at least one external contact spring retainer that tensions said external contact spring in and biases it in a normally open position; wherein said external contact spring compresses sufficiently during a coupling event between said at least two electronic bar coupling modules to enable contact with said internal contact element.

6. The electromagnetic coupling system of claim 1, wherein said external contact element comprises: an external contact portion bearing an external electrical contact surface adjacent to a first inflection elbow transitioning to a sweep portion adjacent to a second inflection elbow transitioning to an internal contact portion bearing an internal electrical contact surface; wherein said sweep portion is in the shape of a partial arcuate curve with radius RC.

7. The electromagnetic coupling system of claim 1, wherein said housing bears an internal contact spring that engages with said internal contact element.

8. The electromagnetic coupling system of claim 1, wherein said external contact element includes a contact element swivel joint on a distal end opposed to a proximate end bearing an internal electrical contact surface.

9. A self-assembling solar pod array comprising:
(a) a plurality of polygonal shaped solar pods of side n, wherein n is selected from 4, 5, 6, and 8, and combinations thereof that enable gapless tiling of a selected horizontal surface area by said plurality of said solar pods when intercoupled;
(b) a plurality, n, of electromagnetic coupling systems located on an exterior face of each side n of said solar pods; each of said solar pods having:
(c) at least two electronic bar coupling modules on each of said exterior faces of said solar pods; wherein said electronic bar coupling modules each have
  (1) a first external contact element;
  (2) a second internal contact element;
  (3) an external contact spring tensioning element;
wherein said first external contact and said second internal contact elements are normally biased in an electronically open circuit configuration by means of said external contact spring tensioning element;
  (4) a first and second permanent magnet coupling element;
wherein said permanent magnetic coupling elements each have a north pole and a south pole;
  (5) a gimbal mounting system;
wherein said gimbal mounting system has a first left cylinder mount and a second right cylinder mount; and
  (6) a housing module;
wherein said permanent magnetic coupling elements are located within said housing module; wherein a first south pole of said first magnetic coupling element faces outward toward a contact face of said electromagnetic coupling system;
wherein an opposed first north pole of said first magnetic coupling element faces inwards;
wherein a second south pole of a second magnetic coupling element and its north pole are situated adjacently on said contact face so that only one of said south poles and one of said north poles of said first and second permanent magnet coupling elements faces outward toward said contact face;
wherein said housing module is located between the first left and second right cylinder mounts of said gimbal mounting system; and
wherein said first left and second right cylinder mounts are opposed to one another and located on a first left side and second right side of said housing module.

* * * * *